US010778295B2

(12) United States Patent
Khandani

(10) Patent No.: US 10,778,295 B2
(45) Date of Patent: Sep. 15, 2020

(54) INSTANTANEOUS BEAMFORMING EXPLOITING USER PHYSICAL SIGNATURES

(71) Applicant: Amir Keyvan Khandani, Waterloo (CA)

(72) Inventor: Amir Keyvan Khandani, Kitchener (CA)

(73) Assignee: Amir Keyvan Khandani, Kitchener (CA)

(*) Notice: Subject to any disclaimer, the term of this patent is extended or adjusted under 35 U.S.C. 154(b) by 297 days.

(21) Appl. No.: 15/585,128

(22) Filed: May 2, 2017

(65) Prior Publication Data

US 2017/0317724 A1 Nov. 2, 2017

Related U.S. Application Data

(60) Provisional application No. 62/330,687, filed on May 2, 2016.

(51) Int. Cl.
*H04B 7/0426* (2017.01)
*H01Q 9/16* (2006.01)
(Continued)

(52) U.S. Cl.
CPC ............... *H04B 7/043* (2013.01); *H01Q 1/36* (2013.01); *H01Q 9/16* (2013.01); *H01Q 9/28* (2013.01);
(Continued)

(58) Field of Classification Search
CPC .. H04B 7/0617; H04B 7/0695; H04B 7/0626; H04B 7/0452; H04B 7/0417;
(Continued)

(56) References Cited

U.S. PATENT DOCUMENTS

| 2,995,752 A | 8/1961 | Shyhalla |
| 3,082,421 A | 3/1963 | Nicholas |

(Continued)

FOREIGN PATENT DOCUMENTS

| EP | 2180623 | 4/2010 |
| GB | 1091437 | 11/1967 |

(Continued)

OTHER PUBLICATIONS

Aono T et al: "Wireless secret key generation exploiting reactance-domain scalar response of multipath fading channels", IEEE Transactions on Antennas and Propagation, IEEE Service Center, Piscataway, NJ, US, vol. 53, No. 11, Nov. 1, 2005 (Nov. 1, 2005), pp. 3776-3784, XP001512766, ISSN: 0018-926X, DOI: 10.1109/TAP.2005.858853.

(Continued)

*Primary Examiner* — Ajibola A Akinyemi
(74) *Attorney, Agent, or Firm* — Invention Mine LLC

(57) ABSTRACT

A communication system where a central node (base-station or access point) communicates with multiple clients in its neighbourhood using transparent immediate beam-forming. Resource allocation and channel access is such that the central node does not necessarily know when each client starts its transmission. Receive beam-forming in such a system is not possible, as beam-forming coefficients for each client should be selected according to the particular channel realization from that client to the central node. Each client is detected early in its transmission cycle, based on either a signature that is part of the physical characteristics unique to that client, or based on a signature that is intentionally inserted in the clients' signal, and accordingly adjusts its beam-forming coefficients.

19 Claims, 16 Drawing Sheets

(51) Int. Cl.

| | | |
|---|---|---|
| *H01Q 9/30* | (2006.01) | |
| *H01Q 9/44* | (2006.01) | |
| *H01Q 11/08* | (2006.01) | |
| *H01Q 19/13* | (2006.01) | |
| *H01Q 19/19* | (2006.01) | |
| *H01Q 21/24* | (2006.01) | |
| *H01Q 1/36* | (2006.01) | |
| *H01Q 19/17* | (2006.01) | |
| *H01Q 19/28* | (2006.01) | |
| *H01Q 25/00* | (2006.01) | |
| *H04B 7/06* | (2006.01) | |
| *H01Q 9/28* | (2006.01) | |
| *H01Q 19/10* | (2006.01) | |
| *H01Q 21/06* | (2006.01) | |
| *H04L 5/14* | (2006.01) | |
| *H01F 5/00* | (2006.01) | |
| *H01F 17/00* | (2006.01) | |
| *H03M 1/74* | (2006.01) | |

(52) U.S. Cl.
CPC ............. *H01Q 9/30* (2013.01); *H01Q 9/44* (2013.01); *H01Q 11/08* (2013.01); *H01Q 19/108* (2013.01); *H01Q 19/13* (2013.01); *H01Q 19/132* (2013.01); *H01Q 19/17* (2013.01); *H01Q 19/19* (2013.01); *H01Q 19/28* (2013.01); *H01Q 21/06* (2013.01); *H01Q 21/24* (2013.01); *H01Q 25/007* (2013.01); *H04B 7/0617* (2013.01); *H04L 5/14* (2013.01); *H01F 5/003* (2013.01); *H01F 2017/0026* (2013.01); *H03M 1/745* (2013.01)

(58) Field of Classification Search
CPC .... H04B 7/088; H04B 7/0619; H04B 7/0632; H04B 7/0408; H04B 7/0413; H04B 7/0421; H04B 7/0456; H04B 7/063; H04B 7/0634; H04B 7/0639; H04B 7/086; H04B 7/10; H04B 7/043
USPC ......................................................... 455/130
See application file for complete search history.

(56) References Cited

U.S. PATENT DOCUMENTS

| | | | |
|---|---|---|---|
| 3,184,747 A | | 5/1965 | Kach |
| 3,725,920 A | | 4/1973 | Hossmann M |
| 3,965,475 A | | 6/1976 | Deerkoski |
| 4,112,430 A | | 9/1978 | Ladstatter |
| 4,268,727 A | | 5/1981 | Agrawal |
| 4,343,005 A | | 8/1982 | Han |
| 4,701,935 A | | 10/1987 | Namiki |
| 4,750,165 A | | 6/1988 | Champagne |
| 5,383,224 A | | 1/1995 | Mizoguchi |
| 5,388,124 A | | 2/1995 | Laroia |
| 5,596,439 A | | 1/1997 | Dankberg et al. |
| 5,630,154 A | * | 5/1997 | Bolstad ............... G06F 15/8046 342/159 |
| 5,691,978 A | | 11/1997 | Kenworthy |
| 5,805,116 A | | 9/1998 | Morley |
| 6,084,919 A | * | 7/2000 | Kleider ................. H04B 1/707 375/285 |
| 6,255,997 B1 | | 7/2001 | Ratkorn |
| 6,281,988 B1 | | 8/2001 | Leung |
| 6,317,092 B1 | | 11/2001 | de Schweinitz |
| 6,369,758 B1 | * | 4/2002 | Zhang ................. H04B 7/0851 342/378 |
| 6,608,864 B1 | | 8/2003 | Strait |
| 6,621,876 B2 | | 9/2003 | Camp |
| 6,731,908 B2 | | 5/2004 | Berliner |
| 6,745,009 B2 | | 6/2004 | Raghothaman |
| 6,781,991 B1 | | 8/2004 | Anderlind |
| 6,864,852 B2 | | 3/2005 | Chiang et al. |
| 6,870,515 B2 | | 3/2005 | Kitchener |
| 6,917,597 B1 | | 7/2005 | Schmidl |
| 6,934,511 B1 | | 8/2005 | Lovinggood et al. |
| 7,002,518 B2 | | 2/2006 | Lin |
| 7,065,036 B1 | | 6/2006 | Ryan |
| 7,091,894 B2 | | 8/2006 | Fudge |
| 7,096,042 B2 | | 8/2006 | Marinier |
| 7,184,466 B1 | | 2/2007 | Seemann |
| 7,187,907 B2 | | 3/2007 | Widrow |
| 7,221,688 B2 | | 5/2007 | Vanness |
| 7,263,143 B1 | | 8/2007 | Rothaar |
| 7,272,366 B2 | | 9/2007 | Haapoja |
| 7,286,096 B2 | | 10/2007 | Jaffer |
| 7,321,611 B2 | | 1/2008 | Fullerton |
| 7,346,100 B2 | | 3/2008 | Kumar |
| 7,471,204 B2 | | 12/2008 | Safarian |
| 7,482,058 B2 | | 1/2009 | Ahmed |
| 7,522,115 B2 | | 4/2009 | Waltman |
| 7,627,325 B2 | | 12/2009 | McCoy |
| 7,693,174 B2 | | 4/2010 | Ishibashi |
| 7,706,744 B2 | | 4/2010 | Rodgers |
| 7,817,641 B1 | | 10/2010 | Khandani |
| 7,920,539 B2 | | 4/2011 | Stanford |
| 7,944,871 B2 | | 5/2011 | Imamura |
| 7,991,160 B2 | | 8/2011 | Guccione |
| 8,023,438 B2 | | 9/2011 | Kangasmaa |
| 8,031,744 B2 | | 10/2011 | Radunovic |
| 8,064,502 B2 | | 11/2011 | Sawai |
| 8,107,906 B2 | | 1/2012 | Lum |
| 8,175,535 B2 | | 5/2012 | Mu |
| 8,184,052 B1 | * | 5/2012 | Wu ..................... H01Q 3/2605 342/368 |
| 8,184,061 B2 | | 5/2012 | Sanford |
| 8,208,628 B2 | | 6/2012 | Yener |
| 8,238,551 B2 | | 8/2012 | Reznik |
| 8,280,046 B2 | | 10/2012 | Rudolf |
| 8,306,480 B2 | | 11/2012 | Muhammad |
| 8,351,874 B2 | | 1/2013 | Dent |
| 8,373,582 B2 | | 2/2013 | Hoffberg |
| 8,385,235 B2 | | 2/2013 | Chiu |
| 8,401,196 B2 | | 3/2013 | Goldberg |
| 8,405,543 B2 | | 3/2013 | Kluge |
| 8,423,986 B1 | | 4/2013 | Grechanik |
| 8,498,585 B2 | | 7/2013 | Vandenameele |
| 8,587,492 B2 | | 11/2013 | Runyon |
| 8,628,650 B2 | | 1/2014 | Ah |
| 8,629,650 B2 | | 1/2014 | Mohammadian |
| 8,644,768 B2 | | 2/2014 | Kluge |
| 8,744,377 B2 | | 6/2014 | Rimini |
| 8,767,869 B2 | | 7/2014 | Rimini |
| 8,823,577 B2 | | 9/2014 | Smid |
| 8,836,581 B2 | | 9/2014 | Nysen |
| 8,836,601 B2 | | 9/2014 | Sanford |
| 8,836,606 B2 | | 9/2014 | Kish |
| 8,837,615 B2 | | 9/2014 | Baldemair |
| 8,842,044 B2 | | 9/2014 | Nysen |
| 8,860,629 B2 | | 10/2014 | Shtrom |
| 8,897,269 B2 | | 11/2014 | Ji |
| 8,918,692 B2 | | 12/2014 | Braithwaite |
| 8,976,641 B2 | | 3/2015 | Choi |
| 9,019,165 B2 | | 4/2015 | Shtrom |
| 9,036,749 B2 | | 5/2015 | Choi |
| 9,054,795 B2 | | 6/2015 | Choi |
| 9,059,879 B2 | | 6/2015 | Jaeger |
| 9,071,313 B2 | | 6/2015 | Monsen |
| 9,077,071 B2 | | 7/2015 | Shtrom |
| 9,077,407 B2 | | 7/2015 | Koren |
| 9,077,421 B1 | | 7/2015 | Mehlman |
| 9,093,758 B2 | | 7/2015 | Kish |
| 9,130,693 B2 | | 9/2015 | Reznik |
| 9,246,234 B2 | | 1/2016 | Rao |
| 9,276,682 B2 | | 3/2016 | Bharadia |
| 9,277,591 B2 | | 3/2016 | Amini |
| 9,281,979 B2 | | 3/2016 | Maltsev |
| 9,337,885 B2 | | 5/2016 | Mehlman |
| 9,571,205 B1 | | 2/2017 | Suarez |
| 9,608,705 B2 | | 3/2017 | Maru |
| 9,622,098 B2 | | 4/2017 | Emmanuel |

(56) References Cited

U.S. PATENT DOCUMENTS

| | | |
|---|---|---|
| 9,713,010 B2 | 7/2017 | Khandani |
| 9,791,552 B1 * | 10/2017 | Schuman .............. G01S 7/4026 |
| 10,067,746 B1 | 9/2018 | Yu |
| 10,069,479 B1 | 9/2018 | Desclos |
| 2001/0010495 A1 | 8/2001 | Helms |
| 2001/0024434 A1 | 9/2001 | Ayyagari et al. |
| 2002/0028655 A1 | 3/2002 | Rosener et al. |
| 2002/0032004 A1 | 3/2002 | Widrow |
| 2002/0097810 A1 | 7/2002 | Seki |
| 2003/0043071 A1 | 3/2003 | Lilly et al. |
| 2003/0114128 A1 | 6/2003 | Haapoja |
| 2003/0189974 A1 | 10/2003 | Ferry |
| 2003/0189975 A1 | 10/2003 | Fullerton |
| 2004/0022229 A1 | 2/2004 | Vanness |
| 2004/0076246 A1 * | 4/2004 | Vanderperren ..... H04L 27/2657 375/343 |
| 2004/0132414 A1 | 7/2004 | Sendyk |
| 2005/0020771 A1 | 1/2005 | Ahmed |
| 2005/0024540 A1 * | 2/2005 | Kim .................... H04B 7/0851 348/614 |
| 2005/0052330 A1 | 3/2005 | Mehltretter |
| 2005/0057420 A1 | 3/2005 | Lin |
| 2005/0083863 A1 | 4/2005 | Umei |
| 2005/0275576 A1 | 12/2005 | Fudge |
| 2006/0014491 A1 | 1/2006 | Cleveland |
| 2006/0045063 A1 | 3/2006 | Stanford |
| 2006/0109067 A1 | 5/2006 | Shtrom |
| 2006/0192720 A1 | 8/2006 | Shtrom |
| 2007/0026804 A1 | 2/2007 | Ishibashi |
| 2007/0026807 A1 | 2/2007 | Kish |
| 2007/0036353 A1 | 2/2007 | Reznik |
| 2007/0057860 A1 | 3/2007 | Jaffer |
| 2007/0063875 A1 | 3/2007 | Hoffberg |
| 2007/0070902 A1 | 3/2007 | Elaoud et al. |
| 2007/0080891 A1 | 4/2007 | De Lustrac |
| 2007/0082617 A1 | 4/2007 | McCallister |
| 2007/0082622 A1 | 4/2007 | Leinonen et al. |
| 2007/0132651 A1 | 6/2007 | Nilsson |
| 2007/0189528 A1 | 8/2007 | Ueda |
| 2007/0254692 A1 | 11/2007 | McCoy |
| 2008/0009257 A1 | 1/2008 | Safarian |
| 2008/0063113 A1 | 3/2008 | Gao |
| 2008/0107046 A1 | 5/2008 | Kangasmaa |
| 2008/0123851 A1 | 5/2008 | Guccione |
| 2008/0129640 A1 | 6/2008 | Shtrom |
| 2008/0165874 A1 | 7/2008 | Steele et al. |
| 2008/0233966 A1 | 9/2008 | Scheim |
| 2008/0294970 A1 | 11/2008 | Gross et al. |
| 2009/0092072 A1 | 4/2009 | Imamura |
| 2009/0100313 A1 | 4/2009 | Gross et al. |
| 2009/0135748 A1 | 5/2009 | Lindoff et al. |
| 2009/0141900 A1 | 6/2009 | Ye |
| 2009/0186582 A1 | 7/2009 | Muhammad |
| 2009/0190558 A1 | 7/2009 | Strutt et al. |
| 2009/0213770 A1 | 8/2009 | Mu |
| 2009/0253385 A1 | 10/2009 | Dent |
| 2009/0284218 A1 | 11/2009 | Mohammadian |
| 2009/0323582 A1 | 12/2009 | Proctor et al. |
| 2010/0003931 A1 | 1/2010 | Krishnan |
| 2010/0008406 A1 | 1/2010 | Sawai |
| 2010/0020771 A1 | 1/2010 | Ji |
| 2010/0022201 A1 | 1/2010 | Vandenameele |
| 2010/0086012 A1 | 4/2010 | Rofougaran |
| 2010/0165866 A1 | 7/2010 | Sachse |
| 2010/0165895 A1 | 7/2010 | Elahi |
| 2010/0167662 A1 | 7/2010 | Kluge |
| 2010/0232324 A1 | 9/2010 | Radunovic |
| 2010/0248714 A1 | 9/2010 | Kang |
| 2010/0271987 A1 | 10/2010 | Chiu |
| 2010/0321245 A1 | 12/2010 | Aoki |
| 2011/0110451 A1 | 5/2011 | Tsai |
| 2011/0116639 A1 | 5/2011 | Yamada et al. |
| 2011/0143655 A1 | 6/2011 | Ahn |
| 2011/0149714 A1 | 6/2011 | Rimini |
| 2011/0268100 A1 | 11/2011 | Gorokhov |
| 2012/0027113 A1 | 2/2012 | Gaal |
| 2012/0068904 A1 | 3/2012 | Shtrom |
| 2012/0087424 A1 | 4/2012 | Brown |
| 2012/0113862 A1 | 5/2012 | Santhanam et al. |
| 2012/0159279 A1 | 6/2012 | Braithwaite |
| 2012/0200158 A1 | 8/2012 | Takei |
| 2012/0201153 A1 | 8/2012 | Bharadia |
| 2012/0201173 A1 | 8/2012 | Jain |
| 2012/0220246 A1 | 8/2012 | Kushnir |
| 2012/0281834 A1 | 11/2012 | Reznik |
| 2012/0300680 A1 | 11/2012 | Pietsch |
| 2012/0327881 A1 | 12/2012 | Nakano et al. |
| 2013/0010851 A1 | 1/2013 | Jaeger |
| 2013/0044791 A1 | 2/2013 | Rimini |
| 2013/0089009 A1 | 4/2013 | Li |
| 2013/0089021 A1 | 4/2013 | Gaal et al. |
| 2013/0099974 A1 | 4/2013 | Wang |
| 2013/0102254 A1 | 4/2013 | Cyzs |
| 2013/0114468 A1 | 5/2013 | Hui |
| 2013/0286903 A1 | 10/2013 | Khojastepour |
| 2013/0301487 A1 | 11/2013 | Khandani |
| 2014/0006797 A1 | 1/2014 | Cordella et al. |
| 2014/0126675 A1 | 5/2014 | Monsen |
| 2014/0135056 A1 | 5/2014 | Wang |
| 2014/0157367 A1 | 6/2014 | Zhang |
| 2014/0169236 A1 | 6/2014 | Choi |
| 2014/0204808 A1 | 7/2014 | Choi |
| 2014/0210681 A1 | 7/2014 | Shtrom |
| 2014/0218248 A1 | 8/2014 | Schulz |
| 2014/0219139 A1 | 8/2014 | Choi |
| 2014/0225788 A1 | 8/2014 | Schulz |
| 2014/0269964 A1 | 9/2014 | Du et al. |
| 2014/0333466 A1 | 11/2014 | Mohamadi |
| 2014/0334322 A1 | 11/2014 | Shtrom |
| 2014/0348018 A1 | 11/2014 | Bharadia et al. |
| 2014/0348032 A1 | 11/2014 | Hua |
| 2015/0029906 A1 | 1/2015 | Jana |
| 2015/0043323 A1 | 2/2015 | Choi |
| 2015/0043685 A1 | 2/2015 | Choi |
| 2015/0049834 A1 | 2/2015 | Choi |
| 2015/0063176 A1 | 3/2015 | Hong |
| 2015/0070243 A1 | 3/2015 | Kish |
| 2015/0078217 A1 | 3/2015 | Choi |
| 2015/0085830 A1 | 3/2015 | Nozaki et al. |
| 2015/0139284 A1 | 5/2015 | Choi |
| 2015/0171903 A1 | 6/2015 | Mehlman |
| 2015/0188646 A1 | 7/2015 | Bharadia |
| 2015/0223173 A1 | 8/2015 | Khojastepour |
| 2015/0236750 A1 | 8/2015 | Choi |
| 2015/0249997 A1 | 9/2015 | Clegg |
| 2015/0263780 A1 | 9/2015 | Mehlman |
| 2015/0280893 A1 | 10/2015 | Choi |
| 2015/0311599 A1 | 10/2015 | Shtrom |
| 2015/0312905 A1 | 10/2015 | Seo et al. |
| 2015/0318976 A1 | 11/2015 | Eltawil |
| 2015/0333847 A1 | 11/2015 | Bharadia |
| 2015/0334745 A1 | 11/2015 | Zhao |
| 2015/0341125 A1 | 11/2015 | Bharadia |
| 2015/0341879 A1 | 11/2015 | Shtrom |
| 2016/0127876 A1 | 5/2016 | Kish |
| 2016/0226653 A1 | 8/2016 | Bharadia |
| 2016/0248160 A1 | 8/2016 | Shtrom |
| 2016/0249376 A1 | 8/2016 | Kish |
| 2017/0161635 A1 | 6/2017 | Oono et al. |
| 2018/0075347 A1 | 3/2018 | Alistarh et al. |
| 2018/0373978 A1 | 12/2018 | Yu et al. |

FOREIGN PATENT DOCUMENTS

| | | |
|---|---|---|
| JP | 10502220 A | 2/1998 |
| KR | 1020040096404 | 11/2004 |
| KR | 1020070072629 | 7/2007 |
| KR | 1020120080231 | 7/2012 |
| WO | 1994028585 | 12/1994 |
| WO | 1996022643 | 7/1996 |
| WO | 2011065020 | 6/2002 |
| WO | 2003098823 | 11/2003 |
| WO | 2004007497 | 1/2004 |
| WO | WO 2009156510 | 12/2009 |

(56) References Cited

FOREIGN PATENT DOCUMENTS

| WO | 2010005951 | 1/2010 |
|---|---|---|
| WO | 2010051232 | 5/2010 |
| WO | 2011148341 | 12/2011 |
| WO | 2012042256 | 4/2012 |
| WO | 2016014016 | 1/2016 |

OTHER PUBLICATIONS

Khandani Amir K: "Two-way (true full-duplex) wireless", 2013 13th Canadian Workshop on Information Theory, IEEE, Jun. 18, 2013 (Jun. 18, 2013), pp. 33-38, XP032495648, DOI: 10.1109/CWIT.2013.6621588, [retrieved on Oct. 4, 2013].
Chen, B., et al., "Quantization Index Modulation: A Class of Provably Good Methods for Digital Watermarking and Information Embedding", IEEE Transaction on Information Theory, vol. 47, No. 4, May 2001, pp. 1423-1443.
EP Extended European Search Report for EP App. No. 13790076.7, dated Mar. 2, 2016, 8 pages.
EP Extended Search Report for EP App. No., 13790160.9-1874, dated Jan. 16, 2016, 9 pages.
Extended European Search Report for EP App. 13790948.7, dated Nov. 4, 2015, 9 pages.
Gharavol, E., et al., "Robust Joint Optimization of MIMO Two-Way Relay Channels With Imperfect CSI", Communication, Control, and Computing (Allerton), 2011 49th Annual Allerton Conference on, IEEE, Sep. 28, 2011, pp. 1657-1664, XP032085749, DOI: 10.1109/ALLERTON.2011.6120368, ISBN: 978-1-4577-1817-5.
International Search Report and Written Opinion for PCT/US2013/040822 dated Jul. 18, 2013.
International Search Report and Written Opinion for PCT/US2014/042136 dated Dec. 9, 2014.
International Search Report and Written Opinion for PCT/US2014/051137 dated Nov. 24, 2014.
International Search Report and Written Opinion from PCT/US2014/050968 dated Nov. 19, 2014.
International Search Report for PCT/US2013/040818 dated Jul. 24, 2013.
Jain, M., "Practical, Real-Time, Full Duplex Wireless", MobiCom '11, Sep. 19-23, 2011, Las Vegans, NC, USA, 2011, 12 pages.
Jung II, ., "Achieving single channel, full duplex wireless communication", Proceedings from the Annual International Conference on Mobile Computing and Networking, MOBICOM—MOBICOM' 10 and MOBIHOC' 10—Proceedings of the 16th Annual International Conference on Mobile Computing and Networking and 11th ACM International Symposi, Sep. 20, 2010, pp. 1-12, XP002696691.
McMichael, J. G., et al., "Optimal tuning of analog self-interference cancellers for full-duplex wireless communication". IEEE, Fiftieth Annual Allerton Conference, Oct. 1-5 2012, p. 246-251.
Persson, D., et al., "Joint Source-Channel Coding for the MIMO Broadcast Channel", IEEE Transactions on Signal Processing, vol. 60, No. 4, Apr. 2012, pp. 2085-2090.
Provisional Application, entitled: "Adaptive Non-Linear Digital Cancellation for Full-Duplex Radios", U.S. Appl. No. 61/864,453, filed Aug. 9, 2013.
Provisional Application, entitled: "Cancellation Circuit With Variable Delay and Amplifier", U.S. Appl. No. 61/876,663, filed Sep. 11, 2013.
Provisional Application, entitled: "Feed Foward Signal Cancellation", U.S. Appl. No. 61/736,726, filed Dec. 13, 2012.
Provisional Application, entitled: "Frequency Independent Analog Cancellation Circuit", U.S. Appl. No. 61/864,459, filed Aug. 9, 2013.
Provisional Application, entitled: "Hybrid IF/RF Digital Cancellation Architectures for Full-Duplex Radios", U.S. Appl. No. 61/915,431, filed Dec. 12, 2013.
Provisional Application, entitled: "Interference Cancellation Architectures With Frequency Isolation", U.S. Appl. No. 62/030,240, filed Jul. 29, 2014.
Provisional Application, entitled: "Method and Apparatus for Mitigating Phase Noise to Improve Self-Interference Cancellation", U.S. Appl. No. 61/865,943, filed Aug. 14, 2013.
Provisional Application, entitled: "Near Band Cancellation", U.S. Appl. No. 61/970,852, filed Mar. 26, 2014.
Vaze, R., et al., "To Code or Not to Code in Multi-Hop Relay Channels", arxiv.org, Cornell University Library, May 20, 2008, XP080418936, 30 pages.
Provisional Application, entitled: "Signal Cancellation Using Feedforward and Feedback", U.S. Appl. No. 61/760,518, filed Feb. 4, 2013.
Provisional Application, entitled: "Self Interference Cancellation Architecture for In-Band Full Duplex Relay Node", U.S. Appl. No. 61/871,519, filed Aug. 29, 2013.
Provisional Application, entitled: "Techniques for Digital Interference Cancellation", U.S. Appl. No. 62/002,578, filed May 23, 2014.
Provisional Application, entitled: "Tunable Self Interference Cancellation", U.S. Appl. No. 61/950,742, filed Mar. 10, 2014.
Provisional Application, entitled: "Tuning Algorithm for Multi-Tap Signal Cancellation Circuit", U.S. Appl. No. 61/754,447, filed Jan. 18, 2013.
Korean Patent Abstract of 1020070072629, dated Jul. 4, 2007, 1 page.
Extended European Search Report for EP App. 14865287.8, dated Jul. 4, 2017. 7 Pages.

* cited by examiner

SIMPLE SOURCE FOR GENERATING TRAINING SIGNAL

SIMPLE SOURCE FOR GENERATING TRAINING SIGNAL

INSTANTANEOUS BEAMFORMING EXPLOITING USER PHYSICAL SIGNATURES

RELATED APPLICATIONS

This application is a non-provisional filing of, and claims benefit under 35 U.S.C. § 119(e) from, U.S. Provisional Patent Application Ser. No. 62/330,687, filed May 2, 2016, entitled "Instantaneous Beam-forming Exploiting User Physical Signatures", the contents of which are incorporated herein in their entirety for all purposes.

FIELD

The present invention discloses methods to realize Radio Frequency (RF) beam-forming.

BACKGROUND

Receive RF beam-forming is widely used as a mechanism to improve signal strength and/or reduce multi-user interference. On the other hand, in many scenarios, user scheduling for uplink transmission is not fully pre-determined. This is referred to as Random Access. WiFi systems are a notable example in this category. Other examples include "emerging M2M and IoT applications". Hereafter, methods and systems described herein will be explained in the context of WiFi systems, such 802.11g and 802.11n.

In setups using Random Access, clients access the uplink channel without prior coordination. This means, the Access Point (AP) does not have any prior knowledge about the identity of the client which will next access the uplink channel. In this configuration, AP can determine the identity of the client sending in the uplink only after the preamble of the corresponding uplink packet is received and is successfully decoded. Hereafter, this feature is refereed to as Uplink Client Anonymity. This shortcoming makes it difficult for the clients who are in deep fade to even establish the link. For those clients that the uplink signal is strong enough to be heard by the AP (establish the link), being subject to deep fades will reduce the throughput and increases the delay. AP's are typically unable to adjust its antenna (beam-forming) pattern to provide each client with a better reception during this stage.

Due to Uplink Client Anonymity, Transparent Beam-forming in the uplink is more challenging as compared to the case of downlink. As a consequence, prior art in Transparent Beam-forming is limited to downlink transmission. In particular, some prior art relies on observing the packet-level error behavior in the downlink, and accordingly determines a transmit (downlink) antenna pattern for a particular client. The error behavior is gauged by examining multiple antenna patterns and selecting the one that minimizes the Frame Error Rate (FER), wherein FER is measured by counting the number of retransmissions (for any particular client in conjunction with the examined transmit patterns). As a result, methods based on the prior art are slow, and inefficient. Another disadvantage of such prior art techniques stems in their inherent reliance on observing erroneous packets to guide their beam-forming decisions. In other words, they can offer improvements only after several downlink packets are communicated in error. This shortcoming results in delay and reduces the throughput. Another shortcoming of prior techniques is that they are limited to downlink beam-forming, while beam-forming in the uplink is generally more important. The reason is that, in the downlink, an AP typically relies on better power amplifiers as compared to that of resource limited mobile clients. This inherent mismatch (downlink vs. uplink link quality) means that Transparent Beam-forming is actually more important for use in the uplink, yet solutions do not exist.

One reason that Transparent Receive Beam-forming has not been used in network setups using Random Access is that beam-forming coefficients for each client should be selected based on the particular channel realization corresponding to that client, and the AP does not know which client will next occupy the uplink channel.

A challenge in Uplink Transparent Beam-forming concerns computation and tracking of the proper beam-forming weights for each client. These features limit the abilities of the AP in adjusting its receive beam-forming weights in a timely manner in order to provide the best receive gain for the particular client that is occupying the uplink. On the other hand, in transmit beam-forming, the access point is aware of the identity of the client that will be next serviced in the downlink (prior to starting the transmission), and accordingly, can adjust its beam pattern according to the particular client.

DETAILED DESCRIPTION

Figure 1:
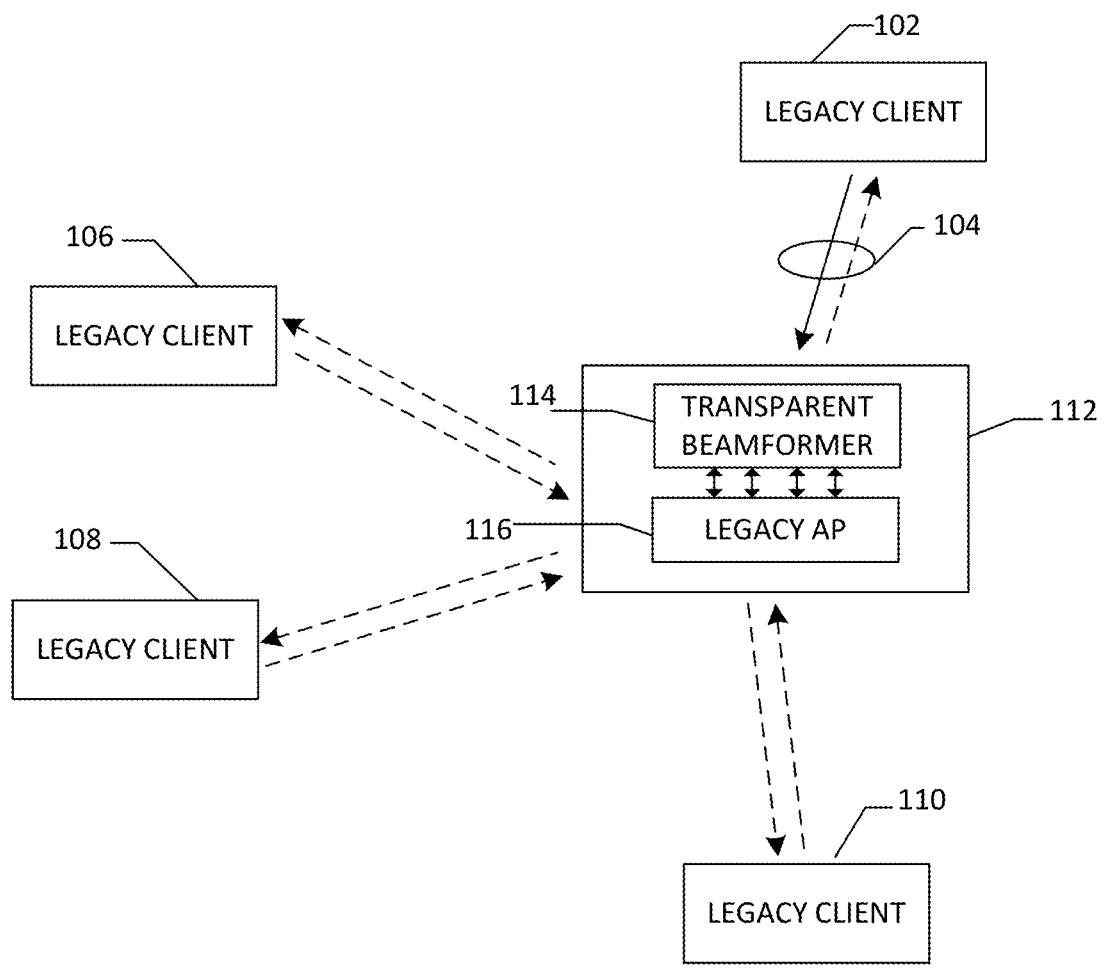
FIG. 1 depicts an embodiment of a wireless network using the receive beam-forming apparatus described herein such that the beam-forming operation is transparent to legacy clients.

Described herein are systems and methods using multiple antennas with beam-forming capability per receive chain, suitable for use with legacy WiFi systema. For example, considering an 802.11n legacy system with some number of receive chains (e.g., four chains may be used as is common in many systems, but higher orders may be used), each of the receive RF ports may be fed by a group of antennas (in one embodiment, eight antennas are used), wherein each such group of antennas is equipped with beam-forming among its members. Beam-forming patterns for each such group (of, e.g., eight) antennas will be determined dynamically and transparently to improve the signal quality. Note that because the receive beam-forming is additional and transparent to legacy systems, it may be combined with any other layer of beam-forming or Multiple-Input Multiple-Output (MIMO) processing that may be applied across the receive chains as part of the receive processing in the underlying legacy receiver. Hereafter, such a beam-forming operation will be called Transparent Beam-forming as it is designed to remain transparent to the operation of the underlying legacy transceiver.

It is also desirable that antenna pattern is readjusted per received packet according to the client that has initiated the corresponding uplink transmission. This will reduce the chances of any packet being received in error.

Methods of this invention for Instantaneous Beam-forming detects each client, very early in its transmission cycle, based on a Signature Vector that is part of the physical characteristics unique to that client. It also finds and tracks the best antenna pattern for each client, and tabulates it together with some other information related to that client.

As mentioned, the AP faces the challenge of computing/tracking the beam-forming weights for different clients. It is desirable that receive beam-forming can be performed early enough during the uplink reception such that the beam-forming weights can be adjusted without losing any packets.

It is also desirable that the transmit beam-forming weights can be learned (and be associated with their respective clients) as part of the uplink beam-forming procedure, and are then applied during the downlink transmission according to the client that is being serviced.

In many such Random Access systems, the transmission starts with a synchronization signal followed by training signals to be used for channel estimation/equalization. In the uplink beam-forming, the systems and methods described herein provide rapid classification and identification of the active client (including operations related to tracking of antenna weights), and accordingly, adaptation of the antenna weights is performed in a manner that the quality of the channel estimation is not compromised. Note that the antenna pattern is in essence part of the uplink channel, and consequently, it affects the channel estimation. Thus, in some embodiments, beam-forming is applied early enough such that the training signals can be effectively used by the access point to estimate the channel, including the role of the newly applied beam-forming pattern in the estimation of the overall channel.

Methods of various embodiments described herein, which are generally referred to herein as Transparent Instantaneous Beam-forming (TIB) may be used without modifying the underlying WiFi standard. TIB is well suited to be integrated in WiFi access points to improve link quality in both directions, while communicating with legacy clients, which remain completely transparent to such a beam-forming operation.

The systems and methods may be used herein in combination with existing low cost WiFi chip sets, while adding features (through simple hardware additions) that enhance the overall performance. Along this line, methods described herein include an Enhanced Transparent Instantaneous Beam-forming (E-TIB) scheme. Recall that TIB was designed to be fully compatible with the underlying standard. This means, only the AP was equipped with TIB, and clients remained unaware of the AP's beam-forming capability. In some applications, as described more fully herein below, both sides of the link belong to the same vendor, and can be slightly modified, while still benefiting from available WiFi chip sets. This is achieved using Enhanced Transparent Instantaneous Beam-forming (E-TIB).

Transparent Instantaneous Beam-Forming, or TIB.

Many embodiments described herein utilize signatures, called Physical Signatures hereafter, to distinguish clients from each other. Example of Physical Signatures include: (1) Frequency mismatch, (2) Channel magnitude and/or phase over frequency, and (3) Channel magnitude and/or phase over different antenna patterns, (4) Angle of arrival, and (5) Doppler frequency. One embodiment described herein uses Physical Signatures corresponding to values of received energy over a few known antenna patterns. Physical Signatures are arranged in a vector, hereafter called the Signature Vector. The signature vector is a set of measured signal levels, where the signal levels correspond to different beam-formed signals that are formed during a training period. The different beam-formed signals are formed using a set of beams referred to herein as signature beams.

Receive RF beam-forming entails combining RF signals from multiple receive antennas after proper adjustments in their relative gain and/or phase values. It is desirable to achieve a good portion of the possible receive beam-forming gain using a simple hardware structure. The present disclosure describes beam-forming strategies, which are not only simple and cost effective with a good performance, but are also compatible with extraction of users' Physical Signatures as described herein.

In a preferred embodiment, each antenna is connected through an adjustable weighting element by which an analog weight coefficient (AWC) may be implemented. The set of AWC for a given beam may be referred to as an AWC vector. In some embodiments, the adjustable weighting element may comprise a phase shifter with two selectable phase values, 0 or $\pi$. The weighting elements may be connected to a signal combiner to generate the beam-formed signal. As a result, M antennas can generate 2M antenna patterns (or beam-formed signals), specified by vectors of size M with elements 1 and −1, representing a phase value of 0 and $\pi$, respectively. M is an integer, and in some embodiments M=8 or 16. The system may be programmed to decide for each phase shift value (0 or $\pi$) such that the summation of phase shifted signals result in more energy at the output of the combiner (combiner has M inputs). Hereafter, the corresponding vector of size M with elements −1/+1 (determining the respective phase shifts) is called the Plus-Minus Phase Vector.

In one embodiment, Plus-Minus Phase Vectors used in the formation of Physical Signatures are mutually orthogonal (as vectors in an Euclidean space). This feature reduces the correlation among elements of the Signature Vectors, and thereby improves the accuracy of the underlying user identification problem. In a further embodiment, the Plus-Minus Phase Vectors used in the formation of Physical Signatures are few vectors from a Hadamard basis. Note that Hadamard basis can be realized as phase shifts are equal to 0 or $\pi$, representing multiplication by +1 and −1, respectively.

Methods of some of the embodiments described herein may be utilized for uplink beam-forming. An embodiment uses the beam-forming pattern decided in the uplink to perform downlink beam-forming as well.

To achieve receive beam-forming, some embodiments form a Signature Table, wherein each entry in this table corresponds to a particular client node, and client nodes can be identified based on their corresponding Signature Vectors with a small probability of error. Each entry (row) in the Signature Table includes several information items related to its corresponding client node, including the best antenna pattern for that particular user. This is in the form of a Plus-Minus Phase Vector, called Best Plus-Minus Phase Vector corresponding to that particular client.

The Physical Signatures as well as the stored AWC vectors (e.g., Best Plus-Minus Phase Vector) corresponding to each client will gradually change as nodes move around, and/or the environment changes. Methods described herein include updating these signatures and stored AWC vectors. In addition, client nodes leave the system and new client nodes may join, and the updating procedure described herein accounts for these phenomena. These procedures may be performed such that the size of the Signature Table remains small to simplify the search. The table is filled with most recent active client nodes, particularly those client nodes that are in the desperate need of the beam-forming gain. The methods of some embodiments described herein account for these features by including the age of the table entrees (last time the corresponding client node was observed and updated), as well as the Signal-to-Noise-Ratio (SNR) of the client in its most recent uplink connection.

Once a client node is successfully connected, and after its corresponding packet is decoded, the access point (AP) will be able to extract the actual identity of the corresponding client in a digital form, such as its Medium Access Control (MAC) address or its Internet Protocol (IP) address. Hereafter, such identity markers are referred to as a Digital Identity. Methods of some embodiments have a provision for storing the Digital Identity of the client nodes as an element in their corresponding row in the Signature Table. This may be used for at least two purposes: (1) to clean up the Signature Table and remove client nodes who have been inactive for a while, or are not a priority as their signal is strong enough, and (2) to decide which beam-forming pattern should be used in the transmit phase (transmit beam-forming). Note that, unlike uplink, in down-link transmission, the identity of the targeted client is known prior to initiating the over-the-air transmission. For the purpose of transmit beam-forming, methods described herein may extract the Digital Identity of the client to be served next (in the downlink) prior to initiating the downlink transmission, and accordingly selecting the corresponding stored beam-forming pattern according to the AWC vector (e.g., in some embodiments a Best Plus-Minus Phase Vector corresponding to that particular client.).

Note that some measurements, for example channel estimation, will depend on the antenna pattern. Therefore, in some embodiments, the signature vector is detected, and the corresponding stored AWC vector (i.e., the best beam forming pattern) should be applied, very early after the reception has started. On the other hand, measurements used for time/frequency synchronization do not depend on the antenna pattern. In the methods described herein, the selected antenna pattern is kept the same during the preamble used for channel estimation and during all the subsequent reception from that particular client node (until the uplink packet is complete).

For the purpose of receive beam-forming, in an embodiment, signals from multiple antennas are combined with relative phase shifts that result in coherent (in-phase) addition of signals. It is also possible to select the beam patterns to minimize the impact of the interference received from unwanted neighboring transmitters. Another embodiment uses a combination of these two objectives. On the other hand, for transmit beam-forming, RF signal transmitted from any given antenna will undergo a phase shift that is the same as the phase shift computed for that particular antenna in the receive beam-forming. Due to channel reciprocity, the beam-forming phase values (e.g., Best Plus-Minus Phase Vector) will be effective in both directions (receive and transmit).

As mentioned, some embodiments described herein are directed to WiFi systems. WiFi signaling starts with a Short Training Sequence (STS), followed by a Long Training Sequence (LTS), followed by successive OFDM symbols. STS is primarily used to: (1) detect the start of an incoming signal, and (2) to estimate the frequency mismatch between the client transmitter and the AP. These measurements are not sensitive to the antenna pattern selection. LTS is the used for channel estimation. Accordingly, methods of some embodiments will perform the following: (1) compute the Physical Signature, (2) perform the matching by searching the Signature Table, (3) gather enough information to enable updating of the Signature Table, and (4) apply the selected beam pattern (Best Plus-Minus Phase Vector) before the LTS starts.

As mentioned, most techniques will be explained in the context of receive beam-forming, while, due to channel reciprocity, same phase values (Plus-Minus Phase Vector) can be used for transmit beam-forming. In signalling from a point TX to a point RX, i.e. TX-to-RX, if TX is equipped with transmit beam-forming and RX is equipped with RX beam-forming, the gains (in dBi) will add.

Many wireless standards rely on multiple antennas. To combine the methods described herein with such standards based on multiple antennas, each legacy antenna is replaced with a configuration of beam-forming antennas explained herein. For example, in a WiFi system based on 802.11n standard, APs typically rely on N=4 antennas, each with a separate receive chain. A typical configuration of this invention replaces each of these 4 legacy antennas with a group of M=8 antennas equipped with phase adjustment capability, resulting in 4×8=32 antennas in total. In this case, the Signature Vectors can rely on the information extracted from all these 32 antennas. In one embodiment, four different AWC vectors are used to generate four beam-formed signals, and the signal levels of the training sequences within the four beam-formed signals are measured to obtain the Signature Vector. Beam-forming patters (e.g., Plus-Minus Phase Vector for each group of antennas) will be typically selected to separately maximize the signals received over each antenna. It can also maximize a measure of performance that involves all antennas, for example, maximize the determinant of the channel matrix which in turn determines the capacity of the underlying multiple antenna wireless system.

Although the methods herein are explained in terms of binary phase values (0/180'), it is possible to use a larger number of phase values distributed around the circle, or include the option of turning off the signal to/from certain antenna(s). Such a construction can be realized using transmission line segments of different lengths, and/or lumped element circuitries in conjunction with RF switches. If there are "K" options (phase and/or gain) for each antenna and "M" antenna are used for beam-forming (in conjunction with each TX/RX chain), then there will be KM different options available for each TX/RX chain. Subsequently, if there are "N" TX/RX chains, there will be a total of KMN options for beam-forming.

Physical Signatures are "features" of clients' channel and/or transmitter. In a preferred embodiment (explained so far), average received energy is used as the "signal feature", but it is possible to use additional features, such as complex gain values over different frequency segments, to further enhance the signature vectors.

RX beam-forming patterns are learned and applied prior to decoding the client's data packet. The use of Plus-Minus Phase Vectors, in conjunction with an efficient search algorithm (tailored to benefit from the features of the Plus-Minus Phase Vectors) may be used. A selected subset of Plus-Minus Phase Vectors of size S, called Signature Beams (SB), will be used as Plus-Minus Phase values to measure/construct the signatures. Energy measured over the SBs will be used as Signature Vector (SV). This means, SVs are vectors of size S, with elements that are energy values, and SBs are vectors of size S, with elements that are −1/+1.

Explanations are primarily presented in terms of the Plus-Minus Phase values, formed by creating 180' phase difference between two RF paths. Other forms of discrete beam-forming strategies include: (1) Using 360/2=180 phase increments, or disconnecting any given antenna if its signal is too weak (three options for each antenna, i.e. K=3). (2) Using 360/3=120' phase increments (three options for each antenna, i.e. K=3).

In an embodiment, different nodes in the network are divided into two sets referred to as "Legitimate Node (LN)" and "Interfering Node (IN)", which are distinguished using their corresponding signature vectors. The Signature Table is a dynamic table with each row corresponding to a node in the network, separated into LNs and INs. Each row includes SV for the particular node, with auxiliary parameters such as "age", "best pattern (e.g., Best Plus-Minus Phase Vector) found so far and its measured energy level", "next combination of Plus-Minus Phase Vector to test", "if the node is LN or IN", "Digital Identity (MAC and/or IP address) in the case of LN", etc. For LN, the Best Plus-Minus Phase Vector is selected/tracked to maximize Signal-to-Noise Ratio (SNR). For IN, the Best Plus-Minus Phase Vector is selected/tracked to minimize the interference.

It is desirable to implement the instantaneous beam-forming in a manner that is transparent to the underlying wireless standard, and consequently, it can be added to the existing chip sets. In coherent schemes (e.g., using QAM), to maintain the required transparency, TIB is restricted to complete all its tasks prior to the training signals used for channel estimation/equalization. For non-coherent schemes (e.g., FSK), used in many IOT applications, this restriction is more relaxed.

Following operations are performed over the Signature Table (ST):

(1) Identification Phase: Identify the node based on measuring the SV and comparing it to the SV entries in the ST. The comparison may include determining a total or average deviation of the measured features to the stored features in the ST and selecting the ST entry having the lowest deviation. Once the client node is identified by comparing the set of measured signals to those sets stored in the ST table, the controller selects a stored beam-former AWC vector based on the set of measured signal levels. The selected stored beam-former AWC vector is used to configure the beam-former to then process the received signal.

(2) Tracking Phase: Update the corresponding analog weight coefficient vector (e.g., a Best Plus-Minus Phase Vector in some embodiments) by continuing the sequential search, starting from the latest "Best Plus-Minus Phase Vector" stored in ST. This phase includes testing L new Plus-Minus Phase Vectors (in one embodiment) and updating the stored AWC vector, or Best Plus-Minus Phase Vector stored in the table if the measured energies over any of the newly tested Plus-Minus Phase Vector turns out to indicate improvement. L is selected based on the time available (note that for coherent transmission systems, the "identification phase", "tracking phase", and "fixing of the newly found Best Plus-Minus Phase Vector" should be all completed prior to the arrival of training sequence which will be used for channel measurement (to be used for equalization).

Enhanced Transparent Instantaneous Beam-forming (E-TIB): So far, methods described herein have been explained when beam-forming is used at the AP and clients are legacy units without any modifications in their structures. In such setups, the link quality is enhanced, while clients remain transparent to its operations. In other words, client nodes enjoy a better connection without the need to modify their hardware/software, nor their signaling structure. On the other hand, in some scenarios such as backbone wireless coverage or last mile applications, both ends of the wireless connection can be modified as long as both ends adhere to the changes. In another embodiment, such setups are further enhanced by inserting (or superimposing) a Signature Signal within the legacy signal structure, which will be in turn detected by the receiving end and used to distinguish the transmitted signal as belonging to the network, and possibly even extract the identity of its transmitting node, in a timely manner. Hereafter, this is called the Enhanced Transparent Instantaneous Beam-forming (E-TIB), in contrast to the base embodiment without this feature which was referred to as Transparent Instantaneous Beam-forming (TIB). In some embodiments of E-TIB, any signal that does not contain the added signature will be classified as interference, which in turn will be nullified in the process of finding the antenna beam patters (Best Plus-Minus Phase Vector). In these embodiments, the beam-forming algorithm will maximize the signal strengths from/to nodes of the same network, and at the same time, will minimize the effect of the interference observed from neighboring units (such units will not have the inserted Signature Signal). Added signature signals can be separate from the legacy signal in frequency, time or code domains. Examples for the added Signature Signals include: (1) Transmitting a sinusoidal signal in parts of the signal spectrum that is left unoccupied (such as the frequency range near DC or near the edges of the band). (2) Transmitting an additional preamble prior to the start of the legacy preamble. (3) Superimposing a low power spread spectrum signal on top of the legacy signal.

In OFDM based standards such as WiFi, the portion of spectrum around DC (which upon RF up-conversion maps to spectrum around carrier) is left empty. In some embodiments of E-TIB, a low frequency signal is modulated onto the RF carrier and combined with the outgoing RF signal at the RF front-end. This signal is transparent to legacy nodes, while receiving nodes with E-TIB capability can extract and use it to identify Legitimate Nodes, vs. Interfering Nodes. This feature enables separating Interfering Nodes from Legitimate Nodes in a reliable and fast manner. Another option for the insertion of a Signature Signal include formation of a low power, wideband signal (spread spectrum) and combining it with the transmitted signal. It is also possible to insert the added signature signal prior to the start of the legacy preamble.

In another embodiment, the Signature Signal embedded in the RF signal in E-TIB carries information to be added to the Signature Vector and used in distinguishing/separating Legitimate Nodes. Information regarding Digital Identity of the transmitting node can be embedded in the inserted signature signal using simple modulation strategies, in particular differential binary phase shift keying may be used in some embodiments.

In the WiFi standards, the available bandwidth is divided into multiple sub-channels. In this case, the wireless network in which both ends are equipped with E-TIB signaling methods will switch between different sub-channels for the purposes of limiting their impact on other links that are not part of their setup.

Using Two Sets of Phase Shifters to Enable Parallel Training: So far, methods have been explained in terms of using M antennas per chain, each equipped with its own phase rotation unit. To further improve the performance, in another embodiment, the set of antennas are connected to two separate sets of phase shifter units, A and B, each of size M. More generally, each set of antennas may have two sets of analog weight coefficient multiplier elements to form two separate beam-formed signals. One set of phase shifters, say A, at the end of the STS (upon completion of its standard training phase) will feed the beam-formed signal to the receiver chain to be decoded, while the other set, B, continues to undergo an enhanced training phase by examining further patterns. During the enhanced training phase of B, the system can: (1) Examine more patterns for the legitimate client, that, at the time, is under service over set A (in order to find a better pattern for the next time that client connects over B), and/or (2) Discard some patterns that result in high interference from interfering nodes that are likely to be active in the immediate future. Interfering nodes can be followed by listening to any incoming preamble signal throughout the enhanced training phase of set B, which will be necessarily from an interferer (as, at that time, the channel is occupied by a legitimate client over set A and other legitimate clients do not transmit). In the case of WiFi, this entails detecting further occurrence(s) of the STS during the enhanced training phase over B. This is achieved by computing the autocorrelation over sliding windows of size 16 (see FIG. 8 for STS), and examining the peaks. This feature allows the beam-former to continually follow interfering nodes as part of the enhanced training of set B without disturbing the main reception, which will be concurrently under progress over set A (after completion of A's standard training). This feature provides the beam-forming algorithm operating over set B with a longer observation window towards making better decisions (for enhancing signal strength and/or for reducing interference). In particular, the system, upon detecting an interferer, may test the current AWC vector for the desired legitimate client and additional candidate AWC vectors, and remove those that produce features (such as high energy) associated with the interfering signal. Note: It is likely that the same client and the same interferer will continue in the immediate future (due to the bursty nature of WiFi) and it helps to monitor which patterns are better in terms of improving signal and reducing the interference, because it is reasonable to assume that the same legitimate client and interfering node will become active once gain in the immediate future.

The phase shifter set under enhanced training (set B) and the one with standard training (set A), which is used to feed the receiver at the end of the STS of the legitimate client, will switch their roles according to a pre-programmed periodic schedule, or as the underlying control structure deems necessary. This means, at any given time (say at even times), one of the two sets undergoes the enhanced training phase, while the other set will be connected to the RF input (after the standard training prior to the end of STS).

Transmit Beam-forming: many of the techniques discussed so far have used the ability to identify nodes in a fast manner, i.e., prior to the start of their data carrying signal and its associated training signals. This feature enables identifying the nodes prior to demodulating their signals, i.e., prior to extracting their Digital Identity captured in their digital (MAC/IP) address. On the other hand, in transmit mode, the Digital Identity will be available prior to starting the wireless transmission phase. This feature will be used to select the Best Plus-Minus Phase Vector for the transmit phase, which according to reciprocity principle, will be the same as the Best Plus-Minus Phase Vector of the corresponding client extracted in the receive mode.

Cleaning of the Signature Table (ST): To avoid overflow of the Signature Table, and improve the accuracy of client identification, redundant entries may be removed or given less priority in the search. Examples includes duplicates, nodes which have left the network, nodes that have aged and need to be refreshed, and Interfering Nodes that are classified by mistake and Legitimate Nodes. An algorithm (Table Cleaning Algorithm-TCA) will run in parallel with the reception phase. TCA has less constraints on "execution-speed" and "time-to-finish". TCA compares the signatures and considers all entries' age-values to decide about combining entries or removing the old ones, and removing the entries that are not part of the network (have been included by mistake). TCA can rely on the Digital Identity of the node (MAC/IP), which will be available with delay (after the packet is decoded), to prune the table and/or to merge multiple entries through combining or simply replacing duplicate entries by one of them, typically the most recent one. TCA benefits from side information such as "acknowledgement" and "MAC/IP" address.

Auxiliary Receiver as a Finite State System: The status of the Auxiliary Receiver is categorized in terms of several states. Examples of some of the states are provided next. The explanations are provided in the context of WiFi, and similar line of definitions and strategies would be applicable to other standards. The actual implementation will not be limited to the set of states described below, but other variations/extensions may be made. In addition, the number, definition and the role of states may change from scenario to scenario, for example depending on the environment (residential, enterprise, indoor, out-door), level of interference, type and volume of traffic, etc. This means the state diagram adapts to the situation. The reason for making such a state diagram adaptive is to capture the impact and significance of these different factors in its underlying decision-making processes.

Idle State: Receiver is listening and looking for an incoming preamble (peak in the STS correlator), while measuring the energy level, which is obtained by averaging the sample energy values over several, say 100, consecutive samples with a moving average, or other known techniques, for smoothing and noise reduction. Note: While in idle state, the Auxiliary Receiver changes the beam-forming patterns (Plus-Minus Phase Vectors) with the objective of finding a subset of patterns that would reduce the noise floor of the system. This subset will have a higher weight in following stages of decision-making for selecting the Best Plus-Minus Phase Vector (best pattern) for each Eligible Client.

Active State: Receiver has detected a preamble (peak in the STS correlator), but the end of the packet is not reached. End of the packet is identified by a combination of the following criteria:
      1. Energy level falls below certain threshold, wherein energy level is obtained by averaging the sample energy values over several, say 100, consecutive samples with a moving average, or other known techniques, for smoothing and noise reduction.
      2. Energy level has already fallen and legacy AP has sent an acknowledgment.
      3. Energy level has already fallen and legacy AP has successfully decoded a packet.
    Note: While in the Active State, the Auxiliary Receiver continues to search for incoming preambles, while the pattern is kept fixed (if there is a single set of beam-formers), or changed to gather more information (if there are two sets of beam-formers, and for the set that is under Enhanced Training).

Doubly Active State: Receiver has detected a preamble (peak in the STS correlator), but before detecting the end of packet, a second preamble is detected.

Error State: Auxiliary receiver is in the idle state, but legacy receiver generates an acknowledgement and/or detects a packet (with CRC failed or passed).

Rules Concerning Transitions Between States and the Associated Decision-Making Process:

These rules and decision-making procedures are not the same for all situations. These rules are typically adapted to the setup, e.g., based on the (1) amount of possible handshaking with the underlying legacy WiFi receiver, (2) amount of interference in the environment, (3) general behaviours of Eligible Clients and Interferers, for example the type of traffic and physical environment (if it is a residential network, enterprise network, indoor, outdoor, etc.), (4) if the auxiliary receiver is equipped with two phase shifter units, or only one, (5) if the setup is E-TIP or simply TIP, (6) carrier frequency and bandwidth (e.g., if the channel is 20 MHZ, 40 Mhz, or 80 Mhz in 802.11AC), (7) number of chains in the legacy receiver and its mode of operation (MIMO with multiplexing gain, MIMO with diversity gain, and if the AP is relying on Spatial Division Multiplexing of clients, or not, (8) statistics of the number of retransmissions in the network, and (9) availability SINR measurements', latency, etc., reported by the underlying legacy AP. Next, some examples are provided for some of the more important decision-making procedures.

Decisions and their Criteria:

In some embodiments, there are two tables for clients: (1) Table of Eligible Clients and (2) Table of Interferers. The Auxiliary Receiver may make a number of decisions concerning these two tables, with a summary of some of the more important ones provided below.

Decision 1: Delete an entry from the Table of Eligible Clients.
    Decision 2: Delete an entry from the Table of Interferers.
    Decision 3: Move an element from Table of Eligible Clients to Table of Interferers, or vice versa.
    Decision 4: Search to improve the best pattern for the current client (detected in the current Active State). Update the corresponding entry in the Table of Eligible Clients. Select and fix the pattern.
    Note: In the case of having two sets of phase shifters, the beam pattern will be fixed only over the set that is connected to the legacy receiver, and the second set (under extended training) can continue examining more patterns and record its observations.
    Decision 5: Update the attributes associated with rows in both tables. Example of attributes for the Table of Eligible Clients include: (1) age, (2) best pattern, (3) bit positions flipped in the previous search for the best pattern for that client, and (4) Digital Entity. Example of attributes for the Table of Interferers include: (1) age, (2) energy level over a number of previously examined patterns and their corresponding binary phase vectors, and (3) bit positions flipped in the previous energy measurement for that interferer.

Decision Making Procedures:

Decisions 1, 2, 3 are performed using a weighting mechanism involving the underlying criteria. The weighting mechanism is adjusted to account for the state of the Auxiliary Receiver, and relevant attributes such as "energy level" and "age".

Decision 4: Before the end of the STS, the Auxiliary Receiver has time to examine 7 different patterns. Four of these will be the ones forming the signature vectors, which are fixed. Then, three more patterns are tested by flipping bit positions in the Plus-Minus Phase Vector. The bit flipping is performed scanning through consecutive bit positions in a circular manner (wrapping around to the first bit, once the last bit is flipped and its effect is measured). Position of the bit flipped in the previous detection of that particular client is tracked and stored as an attribute of the corresponding row in the Signature Table. Upon flipping a bit, if the measured energy level shows improvement, the bit will be kept in the flipped position; otherwise, it will be flipped back. In each new round of bit flipping, the bits are flipped continuing from the bit position stored in the Signature Table, which identifies up to which bit position has been previously flipped/tested for that particular client. Overall, in each round, 7 patterns are tested (four for signature extraction and three in searching for a better pattern), and then the best among these 7 will be selected and the Table of Signatures will be updated accordingly.

System Firmware Adaption: The methods described herein include provisions for (automated) dynamic adaptation of various rules and decision-making procedures. Algorithms running within the hardware of the Auxiliary Receiver will execute these operations. A central computer can gather the information from all the active APs and new updating algorithms can be designed off-line by considering the behaviour and performance of the various AP into account, while considering their environments (residential, vs. enterprise, etc.), and if the AP is TIP, or E-TIP. The corresponding algorithms can be modified through automated upgrade of the system firmware.

Figure 18:
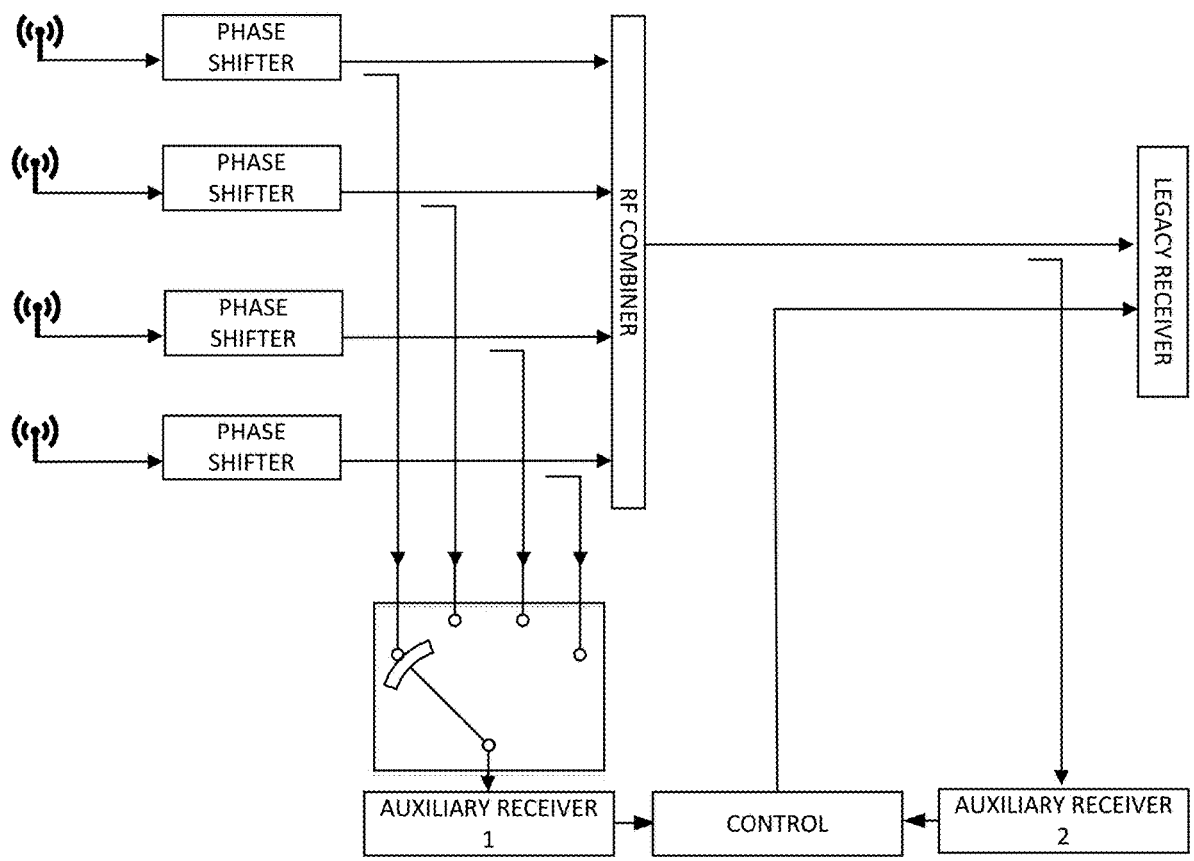
FIG. 18 shows an embodiment wherein, in addition to the output of the combiner, the outputs of individual antennas are monitored towards extracting information about the individual signals separately.

Monitoring Individual Antennas in Addition to their Combined Signal: In the methods described above, the Auxiliary Receiver has been monitoring the output of the combiner related to each legacy RF chain. In another embodiment, in addition to the output of the combiner, the outputs of individual antennas can be monitored towards extracting information about the individual signals separately. This information, for example, can be used towards deciding to adjust the gain/attenuation of individual antennas according to their noise level. An extreme case would be to decide to turn off a particular subset of antennas. A pictorial view of such a configuration is shown in FIG. 18, wherein two separate Auxiliary Receivers are deployed for this purpose (for presentation simplicity, only 4 antennas per each receive chain are shown in FIG. 18).

Figure 19:
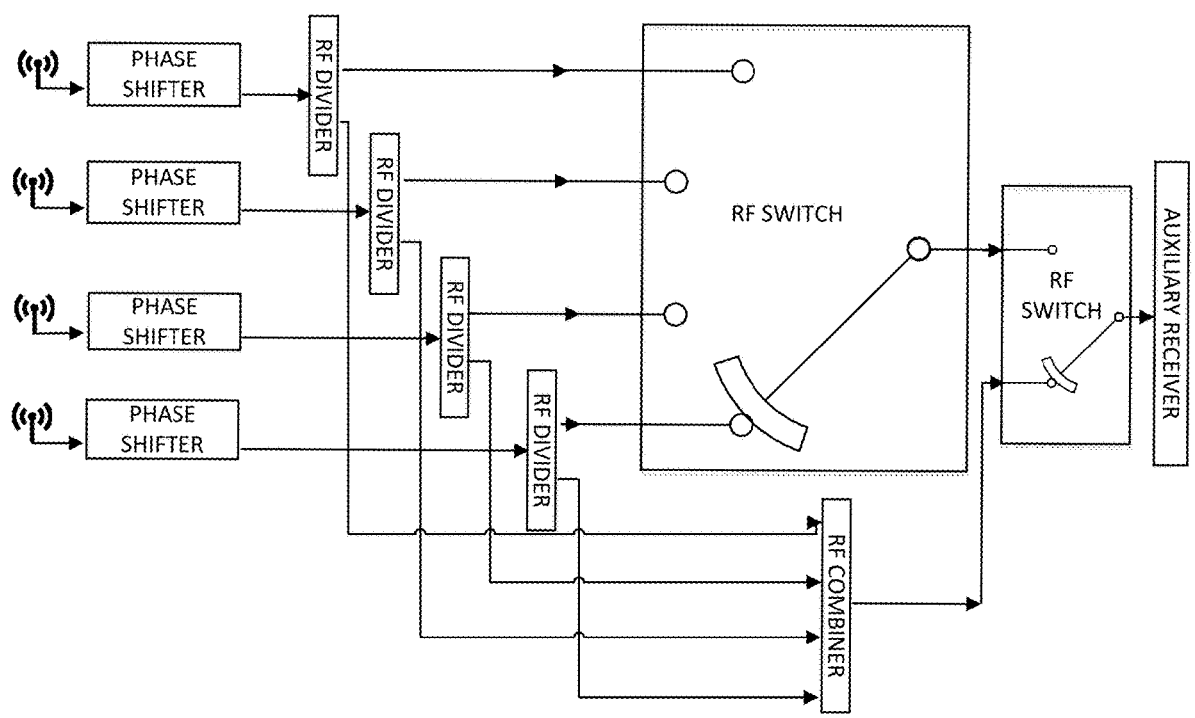
FIG. 19 shows a pictorial view of an embodiment for sharing the Auxiliary Receiver.

Sharing of Auxiliary Receiver(s) (Time Multiplexing among Different Tasks): In another embodiment, a single Auxiliary Receiver is shared (time multiplexed) between these different measurement/monitoring tasks. A pictorial view of such a configuration is shown in FIG. 19 (for presentation simplicity, only 4 antennas per each receive chain are shown in FIG. 19).

Figure 20:
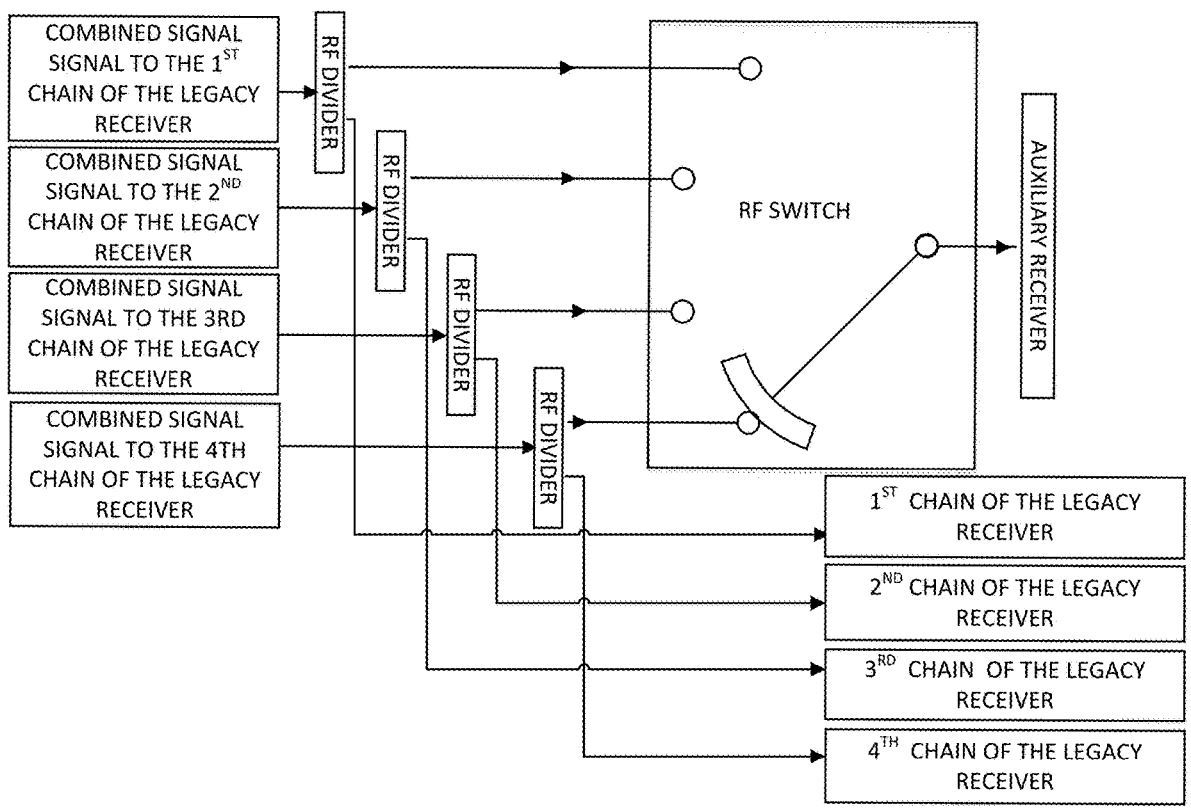
FIG. 20 shows a pictorial view of another embodiment for sharing the Auxiliary Receiver.

In another embodiment, the Auxiliary Receiver is shared (time multiplexed) between the tasks associated with beam-forming for different legacy RF chains. A pictorial view of such a configuration is shown in FIG. 20.

Application in Non-coherent Signaling: Coherent transmission schemes, such as OFDM, rely on channel measurements using training signals for the purpose of equalization. On the other hand, in non-coherent schemes, which are gaining renewed attention in IoT applications, adjustment of antenna beams, formation of "Signature Table" and "Cleaning of the Signature Table" can be partially performed during the signal reception.

FIG. 1 shows a pictorial view of an embodiment of this invention wherein the access point is equipped with receive beam-forming in a manner that the beam-forming operation is completely transparent to legacy clients.

Figure 2:
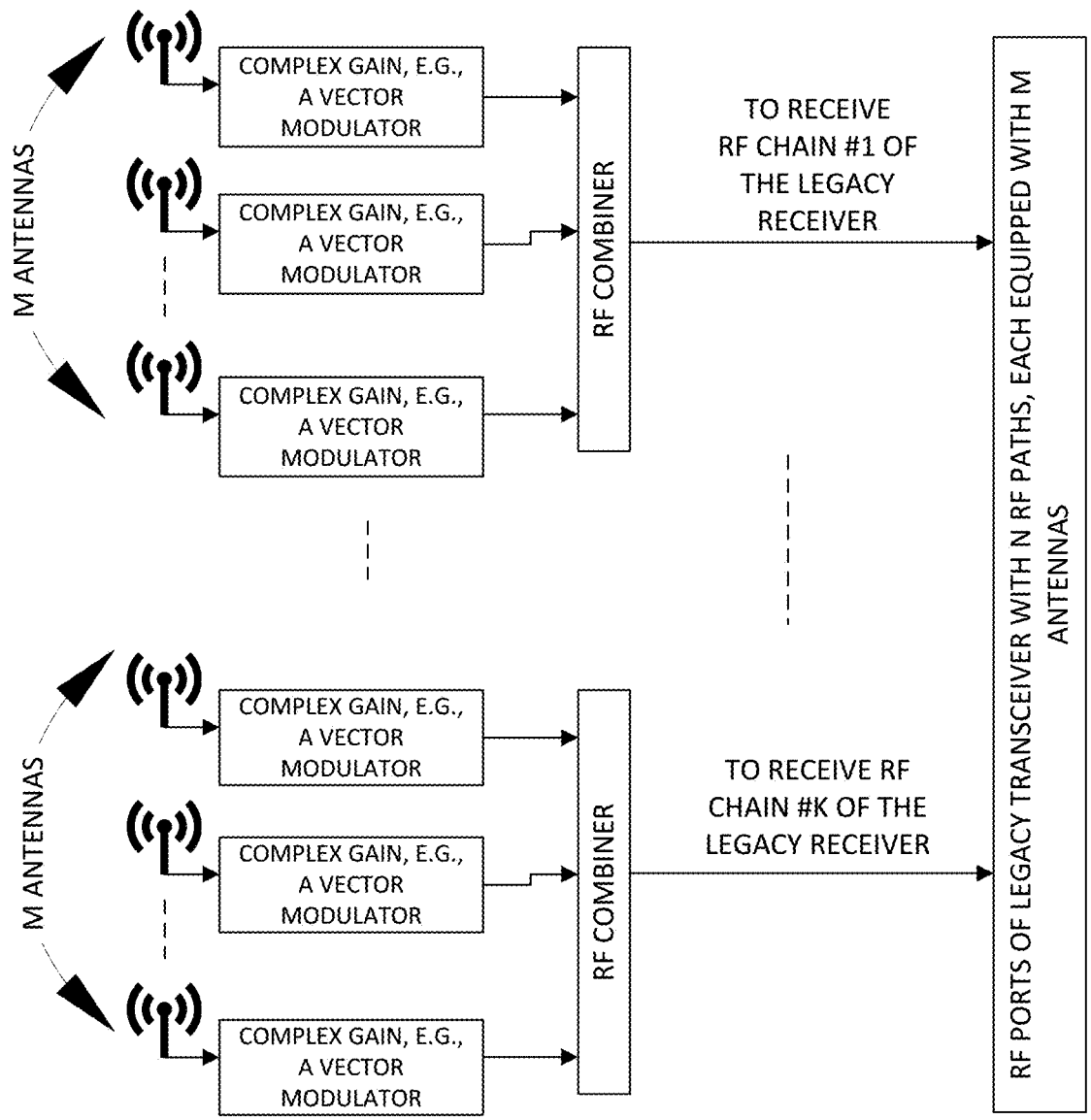
FIG. 2 is a general receive beam-forming apparatus wherein each of the K receive chains is equipped by M antennas.

FIG. 2 shows the structure of a general receive beam-forming apparatus wherein each of the K receive chains is equipped by M antennas, and wherein signals received by the M antennas in each of these K groups are combined after application of complex gains (called antenna beam-forming weights) to adjust their relative magnitude/phase, and the result is fed to the RF input of the corresponding legacy receive chain.

Figure 3:
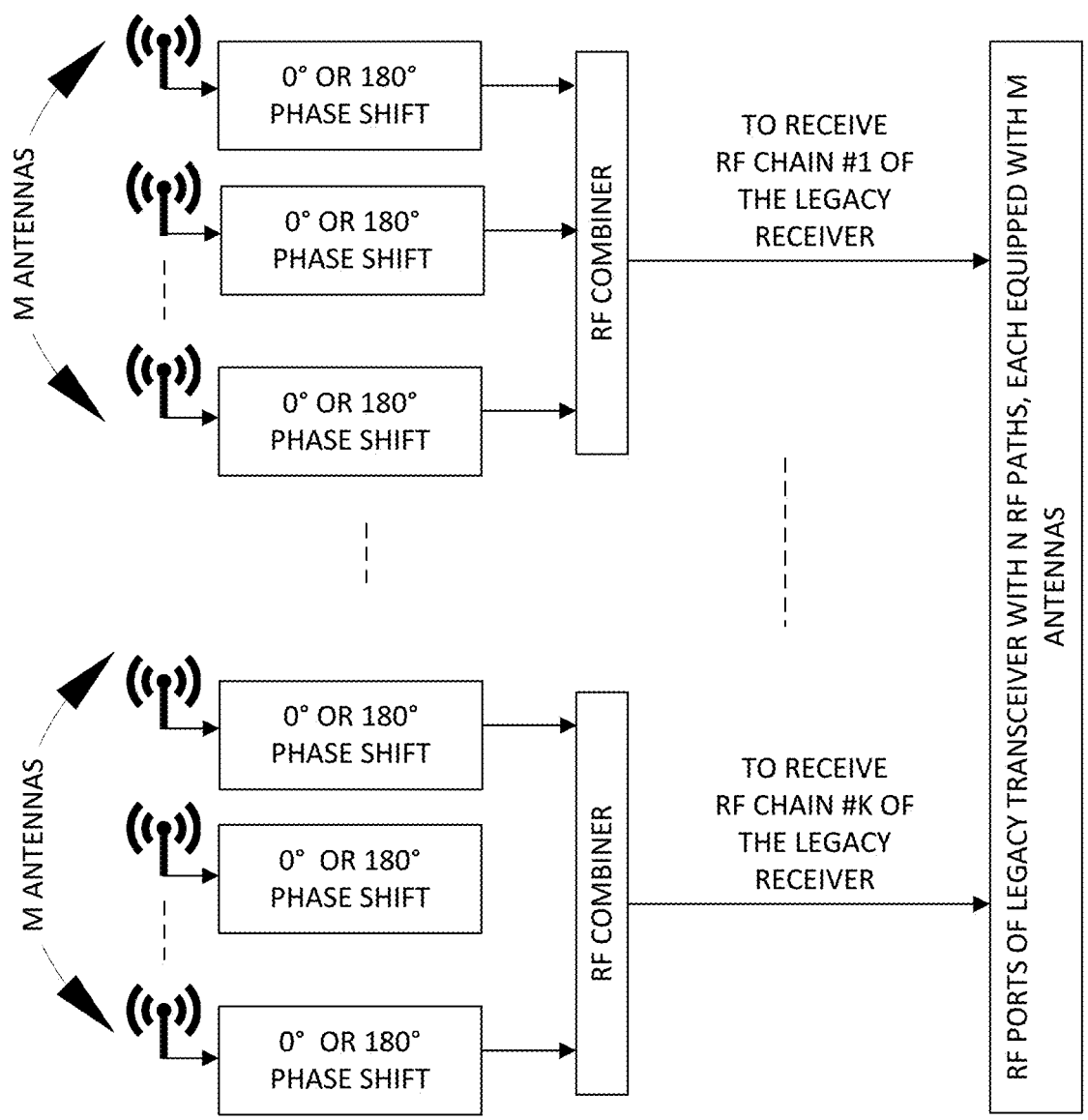
FIG. 3 is an implementation of antenna beam-forming weights, wherein only the signal phase is changed by 180', while signal magnitude remains the same.

FIG. 3 shows a preferred embodiment of this invention for the implementation of antenna beam-forming weights, wherein only the signal phase is changed by 180', while signal magnitude remains the same.

Figure 4:
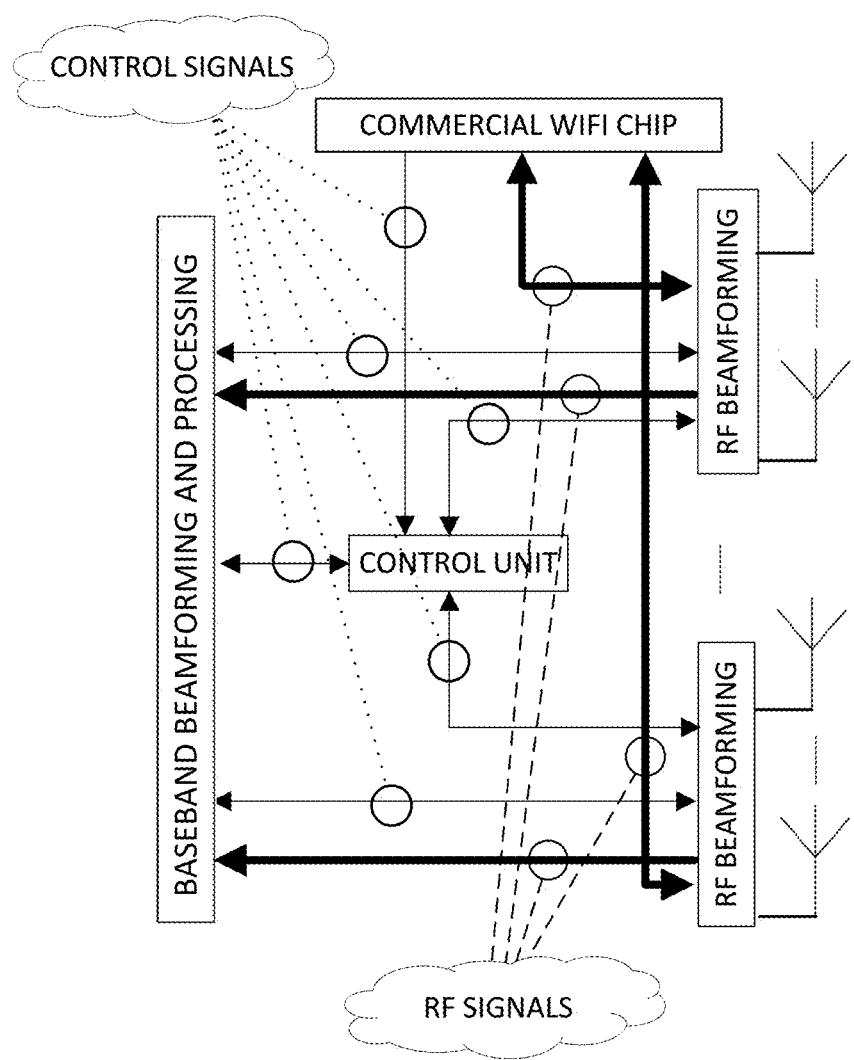
FIG. 4 shows a beam-forming apparatus with its associated control unit.

FIG. 4 shows a pictorial view of the beam-forming apparatus with its associated control unit.

Figure 5:
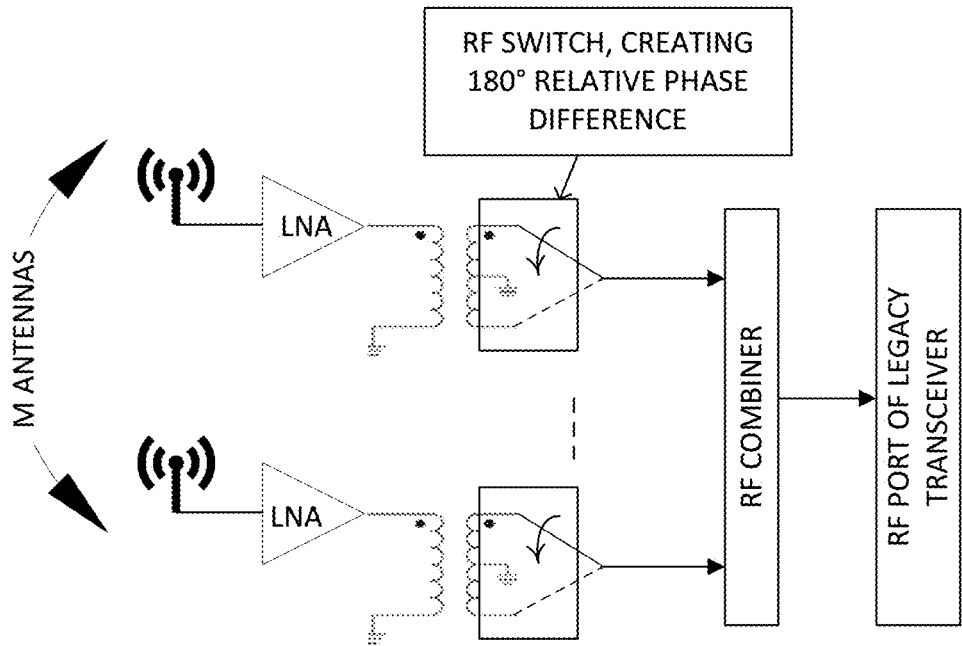
FIG. 5 shows an embodiment for generating 0/180 degrees phase shifts.

FIG. 5 shows pictorial view of a preferred embodiment of this invention for generating 0/180 degrees phase shifts.

Figure 6:
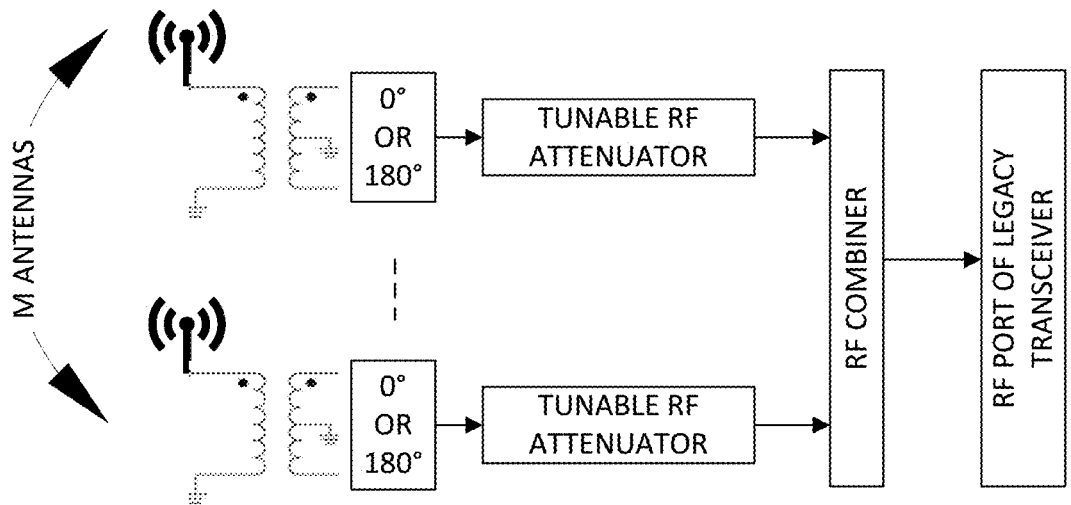
FIG. 6 is another embodiment wherein 0/180 degrees phase shifts are cascaded with RF attenuators to provide some additional degrees of freedom in adjusting antennas beam-forming weights.

FIG. 6 shows pictorial view of another preferred embodiment of this invention wherein 0/180 degrees phase shifts are cascaded with RF attenuators to provide some additional degrees of freedom in adjusting antennas beam-forming weights.

Figure 7:
FIG. 7 shows an example of Plus-Minus Phase Vectors used in the formation of Physical Signatures corresponding to M=8 (# of antennas/chain), K=1 (# of chains), and S=4 (# of signature vectors).

FIG. 7 shows an example of Plus-Minus Phase Vectors used in the formation of Physical Signatures corresponding to M=8 (# of antennas/chain), K=1 (# of chains), and S=4 (# of signature vectors). Total number of antenna patterns is 28=256.

FIG. 7 shows an embodiment of this invention wherein each group of M antennas is equipped with two sets of beam-formers, wherein at any given time (say at even times), one of these sets is being trained while the other set is used to fed the corresponding RF input of the underlying legacy receiver.

Figure 8:
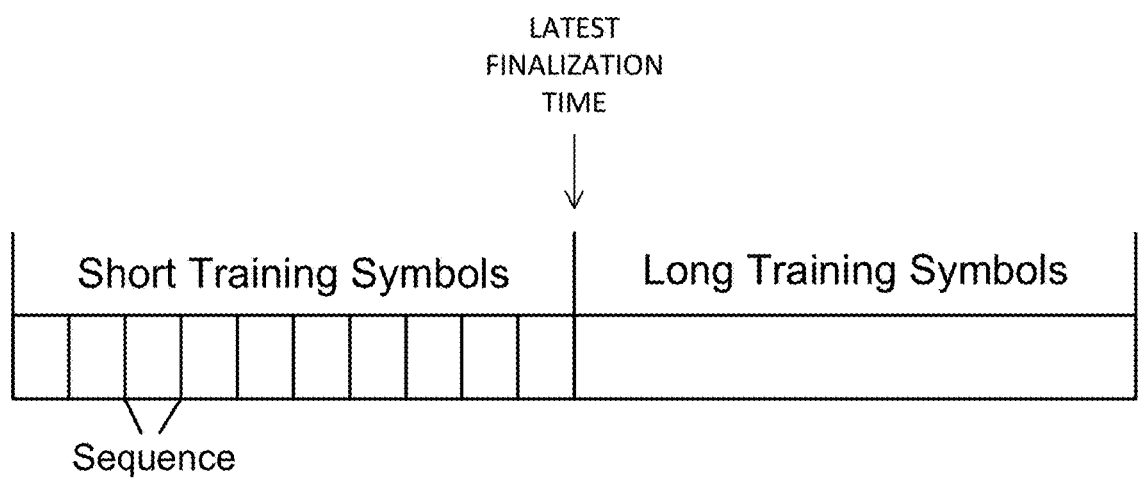
FIG. 8 shows a WiFi preamble, indicating the operations that are completed prior to the start of the Long Training Sequence (LTS), such that channel measurements are performed for the actual antenna configuration that will be in effect.

FIG. 8 shows a pictorial view of the WiFi preamble, indicating the operations that need to be completed prior to the start of the Long Training Sequence (LTS), such that channel measurements are performed for the actual antenna configuration that will be in effect. Short Training Symbols may comprise 10 repetitions of a sequence of length 16. Such sequences may be used for signal detection, time synchronization, and frequency offset measurement. FIG. 8 also shows one embodiment of the latest finalization time, which is the latest time that the extraction and matching of a signature vector, updating of a signature table, and selection of an antenna beam pattern may be finalized.

Figure 9:
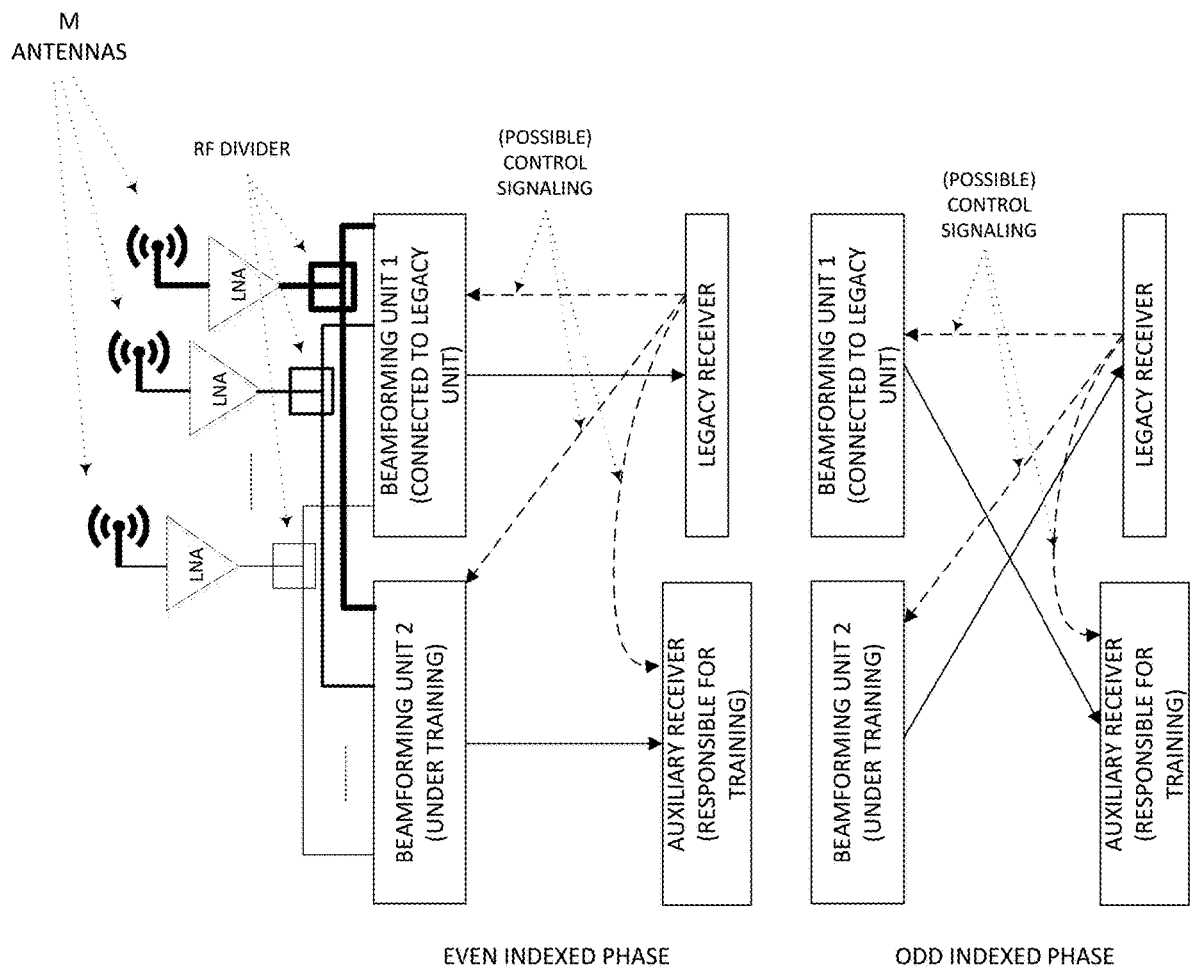
FIG. 9 shows another embodiment wherein each group of M antennas is equipped with two sets of phase shifters operating in parallel.

FIG. 9 shows another embodiment wherein each group of M antennas is equipped with two sets of phase shifters operating in parallel, wherein one of the sets is connected to the legacy receiver at the end of the STS (upon completion of its standard training phase), and the other set continues to undergo an enhanced training phase by examining further patterns for the legitimate client (under active service by the other set), or by discarding patterns that would result in high interference. At any given time (say at even times), one of the two sets undergoes the enhanced training phase, while the other set will be connected to the RF input (after its standard training, prior to the end of STS).

Figure 10:
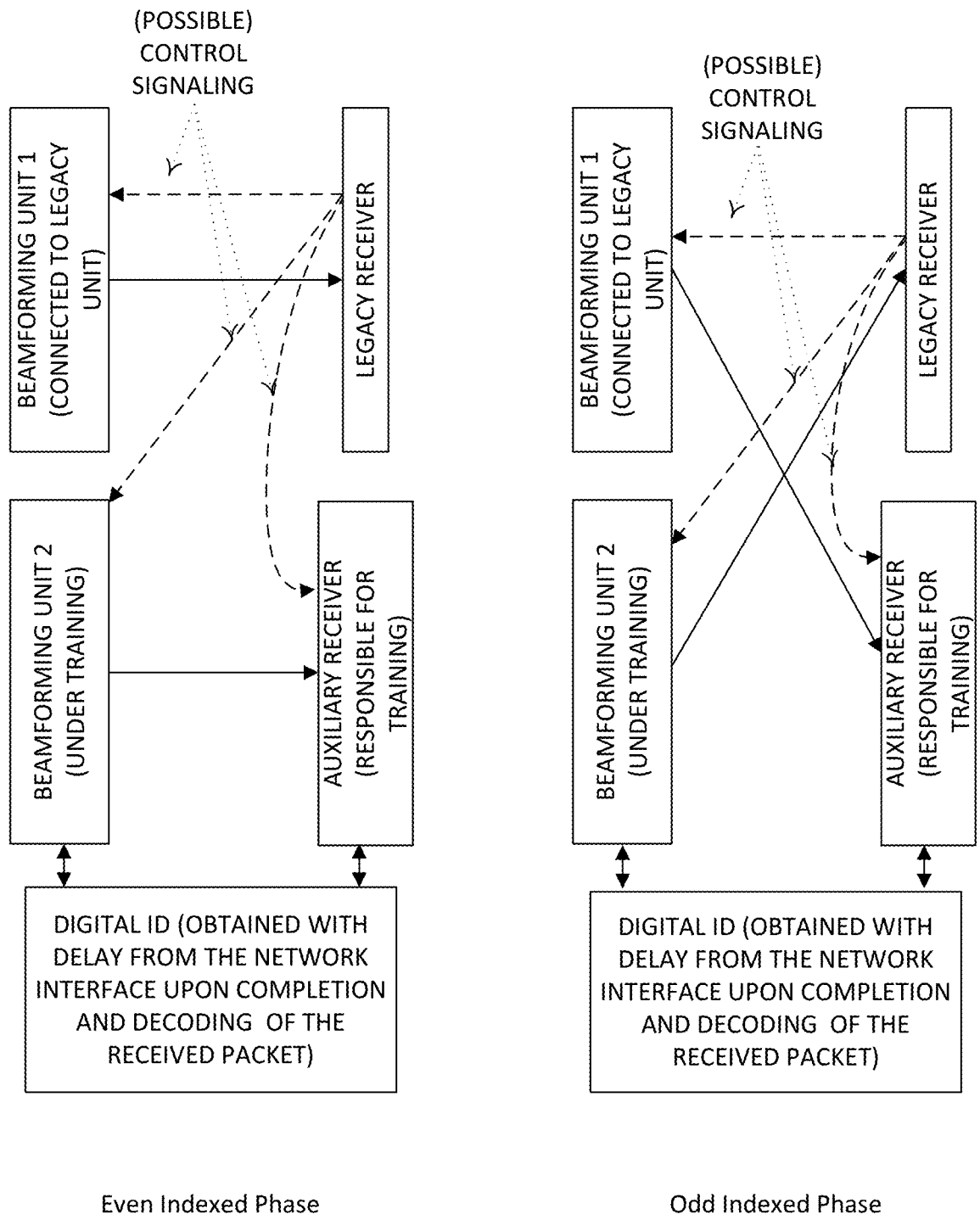
FIG. 10 shows a pictorial view of the switching between the two beam-forming sets related to FIG. 9.

FIG. 10 shows a pictorial view of the switching between the two beam-forming sets related to FIG. 9.

Figure 11:
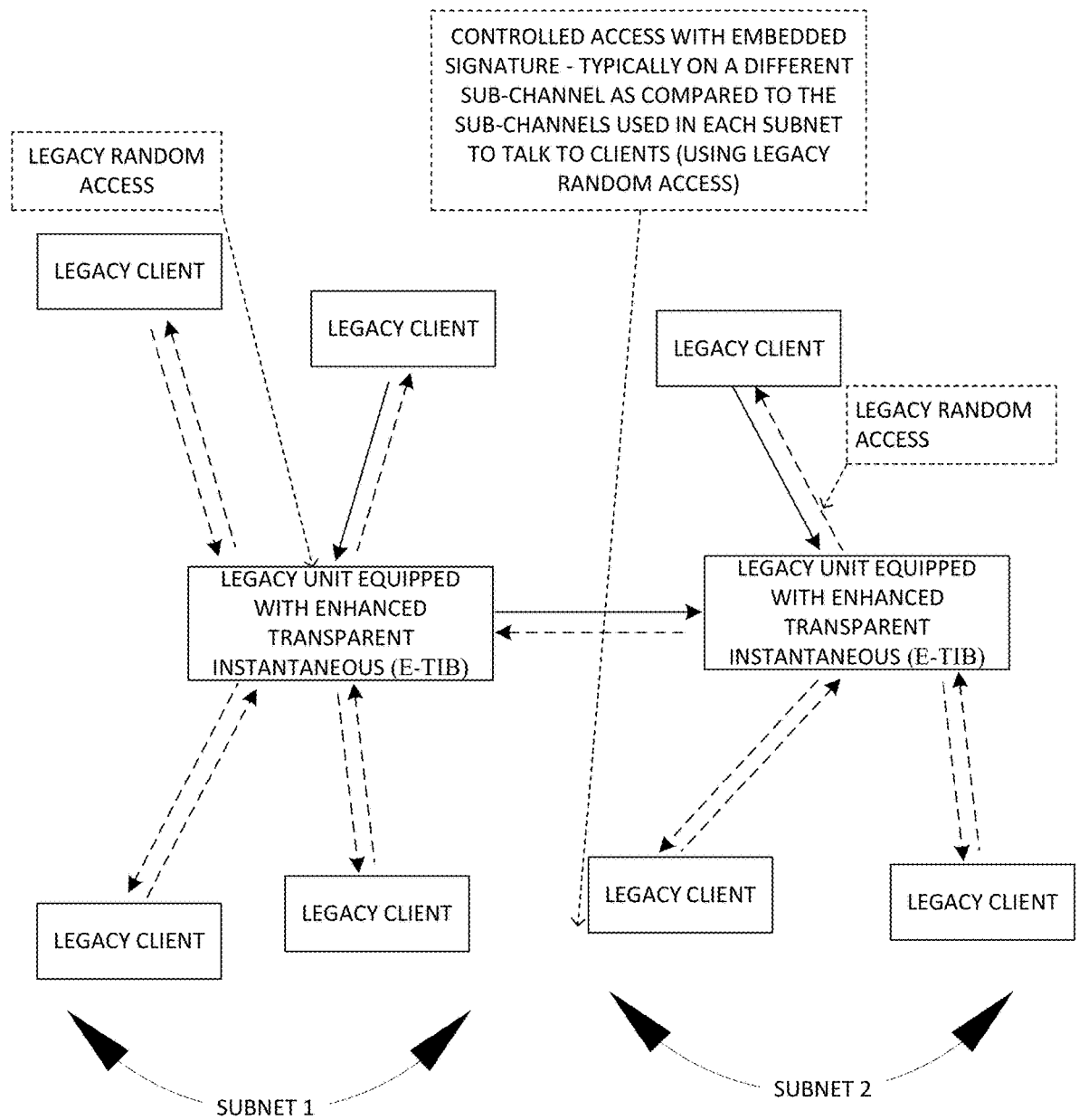
FIG. 11 shows the pictorial view of a network setup equipped with Enhanced Transparent Instantaneous Beam-forming.

FIG. 11 shows the pictorial view of a network setup equipped with Enhanced Transparent Instantaneous Beam-forming.

Figure 12:
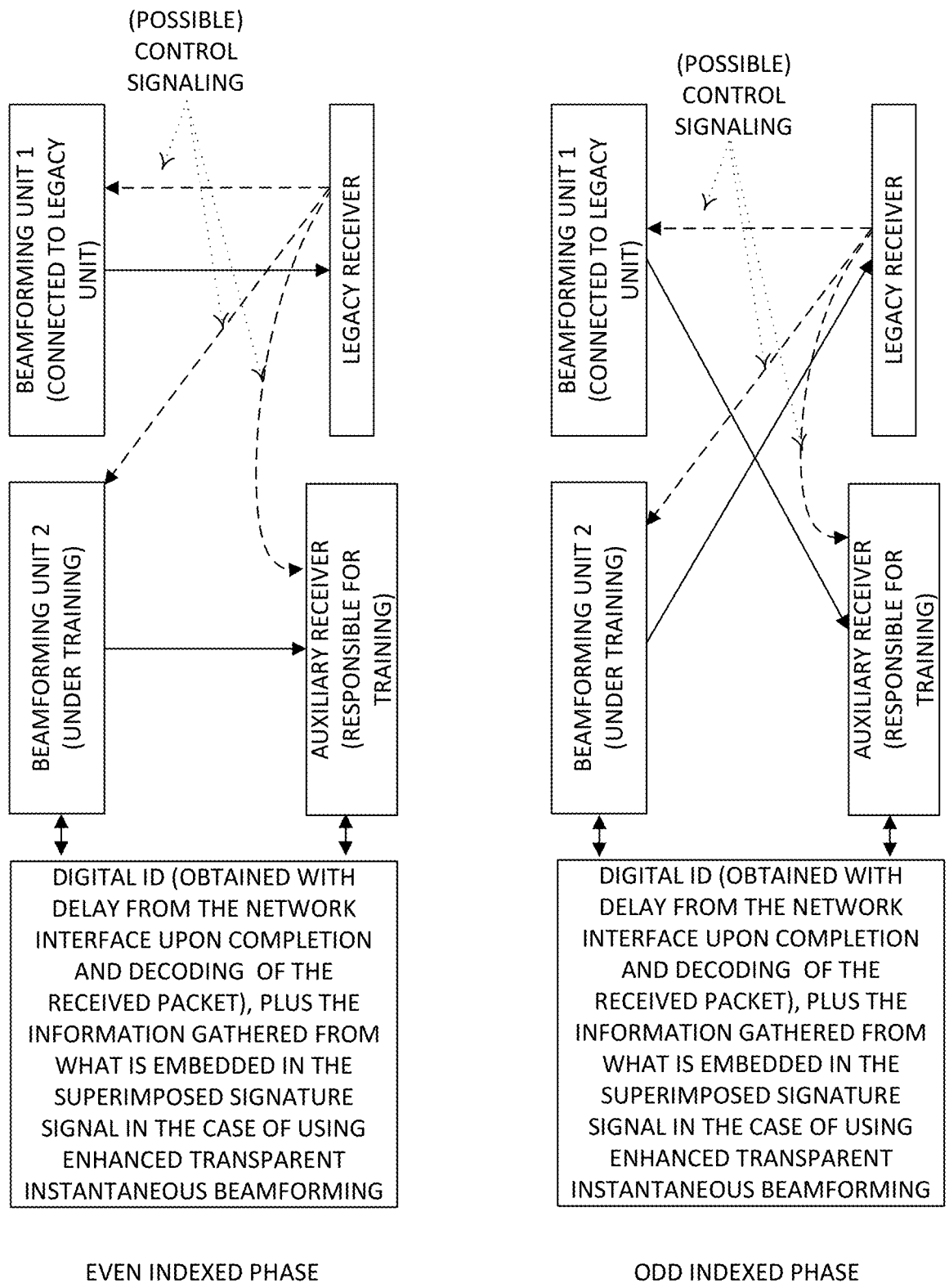
FIG. 12 shows another embodiment wherein each group of M antennas is equipped with two sets of beam-former phase shifters operating in parallel.

FIG. 12 shows another embodiment wherein each group of M antennas is equipped with two sets of beam-former phase shifters operating in parallel, wherein one of the sets is connected to the legacy receiver at the end of the STS (upon completion of its standard training phase), and the other set continues to undergo an enhanced training phase by examining further patterns for the legitimate client (under active service by the other set), or by discarding patterns that would result in high interference. At any given time (say at even times), one of the two sets undergoes the enhanced training phase, while the other set will be connected to the RF input (after its standard training, prior to the end of STS). The formation and updating of the signature tables is enhanced relying on the digital ID of the node being received with delay upon completion/decoding of the received packet from the network interface, plus the information gathered from what is embedded in the superimposed signature signal in the case of using Enhanced Transparent Instantaneous Beam-forming.

Figure 13:
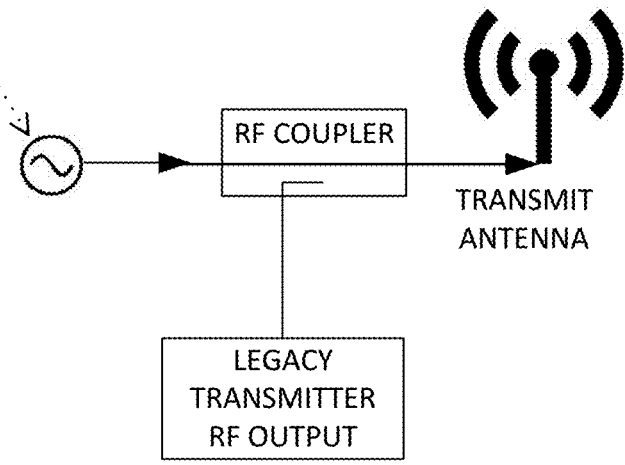
FIG. 13 shows a pictorial view of an embodiment of the disclosed Enhanced Transparent Instantaneous Beam-forming structure for superimposing a sinusoidal signature signal on the RF signal generated by the underlying legacy transmitter.

FIG. 13 shows a pictorial view of a preferred embodiment of the disclosed Enhanced Transparent Instantaneous Beam-forming structure for superimposing a sinusoidal signature signal on the RF signal generated by the underlying legacy transmitter. FIG. 13 also shows a sinusoidal signal (indicated as "sinusoidal signal") with a frequency falling in an unoccupied portion of the legacy spectrum, such as near DC or at a frequency band's edges (or frequency guard band).

Figure 14:
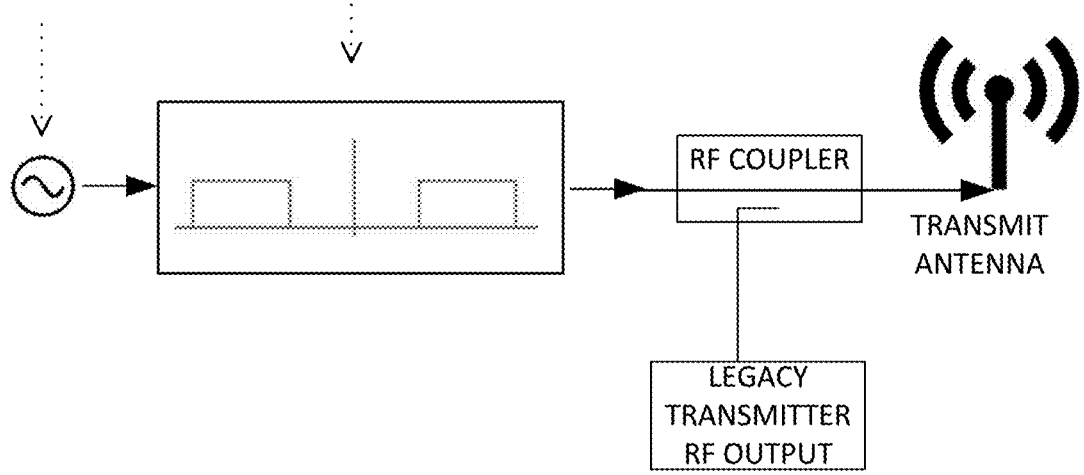
FIG. 14 shows a pictorial view of an embodiment of the disclosed Enhanced Transparent Instantaneous Beam-forming structure for superimposing a sinusoidal signature signal containing modulated data on the RF signal generated by the underlying legacy transmitter.

FIG. 14 shows a pictorial view of a preferred embodiment of the disclosed Enhanced Transparent Instantaneous Beam-forming structure for superimposing a sinusoidal signature signal containing modulated data on the RF signal generated by the underlying legacy transmitter. A preferred embodiment relies on differential Binary Phase Shift Keying to embed data in the superimposed signature. This data is used to communicate a digital identifier (which can be extracted/decoded prior to the end of STS) specifying the node being active. FIG. 14 also shows a sinusoidal signal (indicated as "sinusoidal signal") modulating a low rate binary signal with a modulated frequency range falling in an unoccupied portion of the legacy spectrum near DC. A low rate binary signal contains information related to the node, e.g., a pre-arranged ID number, which may be used by the receiver in determining a proper beam pattern. FIG. 14 shows the sinusoidal signal as an input to a bandpass filter centered at the carrier frequency.

Figure 15:
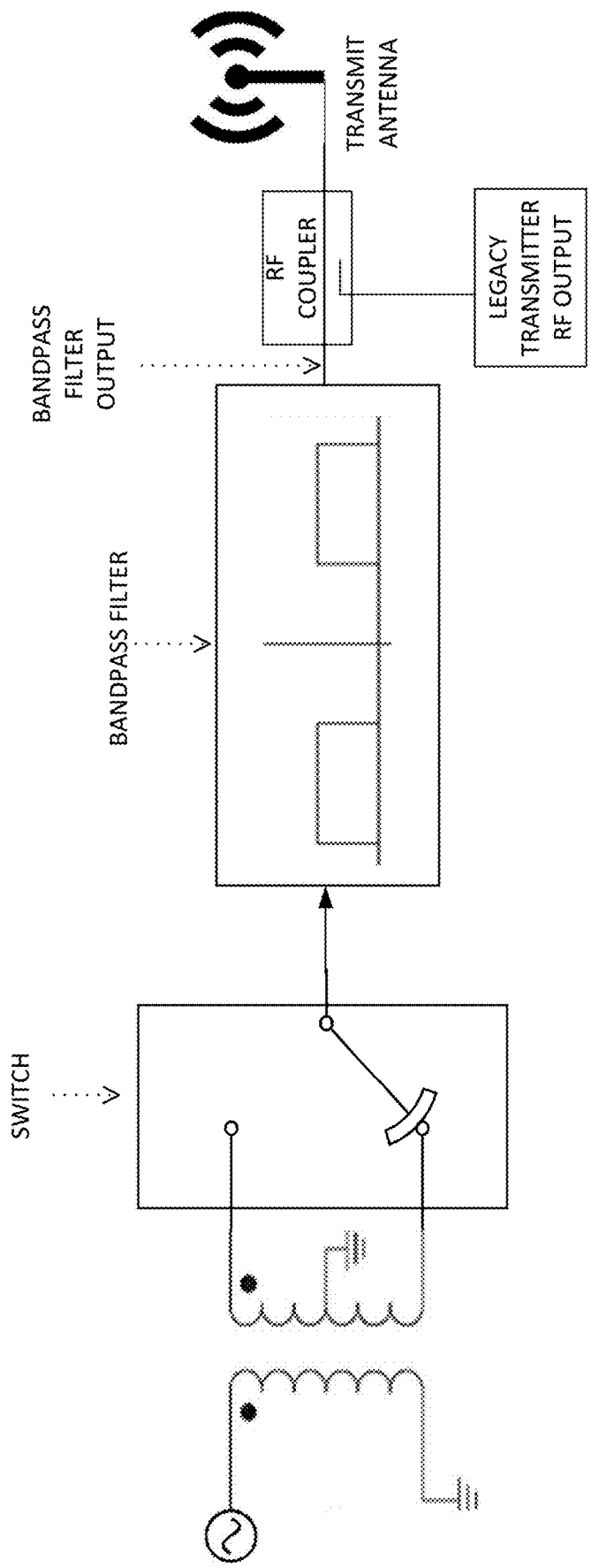
FIG. 15 shows a pictorial view of an embodiment of the disclosed Enhanced Transparent Instantaneous Beam-forming structure for superimposing a spread spectrum signature signal on the RF signal generated by the underlying legacy transmitter.

FIG. 15 shows a pictorial view of a preferred embodiment of the disclosed Enhanced Transparent Instantaneous Beam-forming structure for superimposing a spread spectrum signature signal on the RF signal generated by the underlying legacy transmitter. The RF switches in FIG. 15 in essence generate a Binary Phase Shift Keying signal with a pre-programmed bit pattern and use it as the superimposed signature. The example demonstrates the use of a periodic Alexis sequence as the spreading sequence. A preferred embodiment relies on differential Binary Phase Shift Keying to embed data in the superimposed spread spectrum signature signal. This data is used to communicate a digital identifier (which can be extracted/decoded prior to the end of STS) specifying the node being active. FIG. 15 shows a switch (indicated as "switch") for selecting one of two ends of the secondary phase shift, which may be 0° or 180°. For one embodiment, the secondary phase shift is programmed to generate a periodic alexis sequence, which may be a repetition of the following expression: "[−1 −1 −1 −1 +1 +1 +1 −1 +1 +1 −1 −1 −1 −1 +1 −1 +1 −1 −1 −1 −1 −1 +1 +1 −1 +1 +1 +1 −1 −1 −1 −1]." One side of the switch may be connected as an input to a bandpass filter (indicated as "bandpass filter" in FIG. 15) centered at the carrier frequency. The output of the bandpass filter, which is indicated as "bandpass filter output" and is connected to an RF coupler, may be a signal with binary phase shift keying and periodic repetition of a low correlation sequence, such as an alexis sequence.

Figure 16:
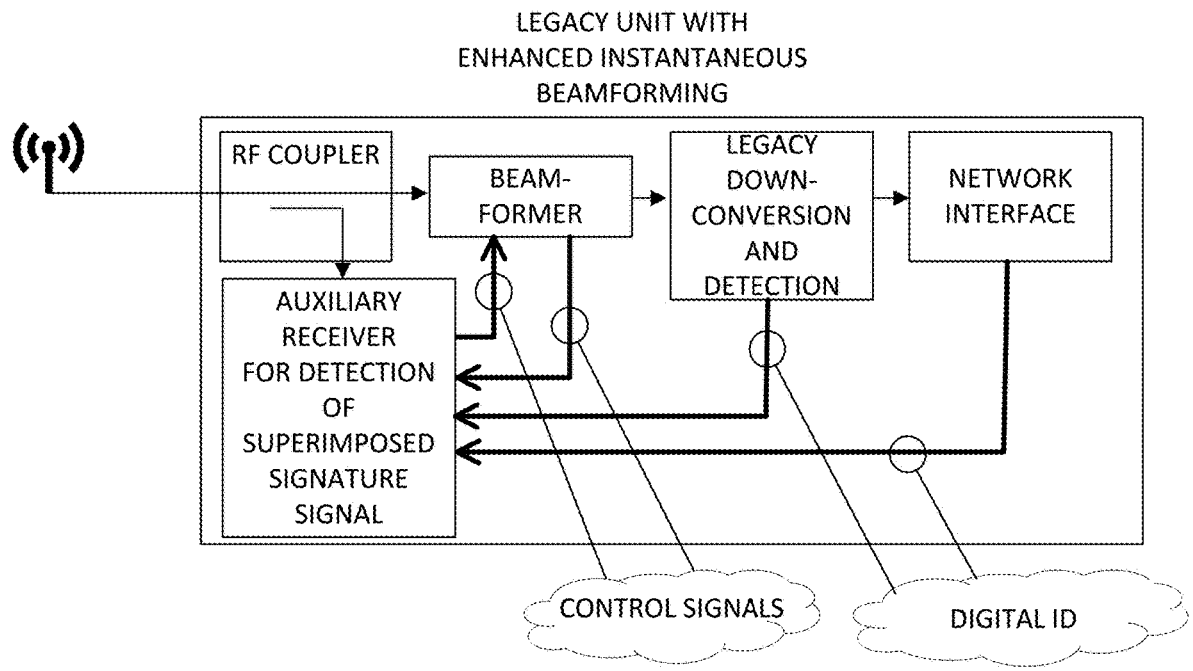
FIG. 16 shows the pictorial view of the control mechanism in Enhanced Transparent Instantaneous Beam-forming.

FIG. 16 shows the pictorial view of the control mechanism in Enhanced Transparent Instantaneous Beam-forming.

Figure 17:
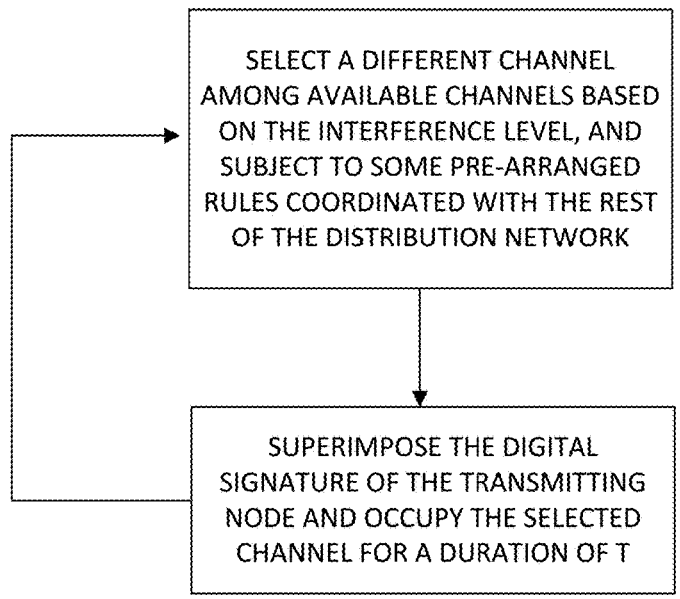
FIG. 17 shows a method of changing the selected channel for the reason of limiting the impact on other users who are sharing the spectrum and are not part of the network, i.e., do not contain the superimposed signature signal.

FIG. 17 shows the procedure in changing the selected channel for the reason of limiting the impact on other users who are sharing the spectrum and are not part of our network, i.e., do not contain our superimposed signature signal.

FIG. 18 shows an embodiment wherein, in addition to the output of the combiner, the outputs of individual antennas are monitored towards extracting information about the individual signals separately.

FIG. 19 shows a pictorial view of an embodiment for sharing the Auxiliary Receiver.

FIG. 20 shows a pictorial view of another embodiment for sharing the Auxiliary Receiver.

The invention claimed is:

1. A method comprising:
    at a receiver:
        detecting a training period of a transmission frame;
        generating a plurality of beam-formed signals using a plurality of predetermined analog weight coefficient (AWC) vectors;
        obtaining a set of measured signal levels by measuring a signal level of each of the beam-formed signals during the training period;
        selecting a previously stored beam-former AWC vector that corresponds to the set of measured signal levels and responsively configuring a beam-former with the previously stored beam-former AWC vector, wherein the beam-former is configured with the previously stored beam-former AWC vector prior to a transmission of a Long Training Sequence (LTS) that follows a Short Training Sequence (STS); and
        processing the transmission frame using the selected previously stored beam-former AWC vector corresponding to the set of measured signal levels.

2. The method of claim 1 wherein the plurality of beam-formed signals are formed sequentially during the training period using a single beam-former.

3. The method of claim 1 wherein measuring the signal level of each of the beam-formed signals comprises determining a magnitude of a known pattern in the training period of the transmission frame.

4. The method of claim 1 further comprising:
    identifying an improved beam-former AWC vector based on the selected previously stored beam-former AWC; and
    using the improved beam-former AWC vector to process the transmission frame, wherein the improved beam-former AWC is used prior to the transmission of the LTS that follows the STS.

5. The method of claim 4 further comprising replacing the selected previously stored beam-former AWC vector with the improved beam-former AWC vector prior to the transmission of the LTS that follows the STS.

6. The method of claim 4 wherein identifying the improved beam-former AWC vector comprises:
    generating a candidate beam-former AWC vector by altering a subset of vector elements of the selected previously stored beam-former AWC vector; and
    comparing signal level measurements obtained using the selected previously stored beam-former AWC vector and the candidate beam-former AWC vector.

7. The method of claim 1 wherein the plurality of predetermined AWC vectors comprise vector elements, and wherein each vector element is selected from a set of 0° and 180°.

8. The method of claim 1 wherein the beam-former comprises a plurality of baluns.

9. The method of claim 8 wherein each balun of the plurality of baluns can selectively provide a received signal or a phase shifted version of the received signal.

10. The method of claim 1 further comprising detecting an identifier signal in a transmitted signal containing the transmission frame and responsively determining that transmitted signal originated from a legitimate node.

11. The method of claim 10 wherein the identifier signal is within one or more spectral gaps of a legacy signal to remain transparent to the operation of a legacy transceiver.

12. The method of claim 11 wherein the identifier signal is a modulated signal carrying a low rate data stream compromising a digital identifier of a transmitting node.

13. The method of claim 11 wherein the identifier signal is inserted at an RF front-end of a transmitting node within a frequency gap around a carrier frequency.

14. The method of claim 1, wherein the set of measured signal levels are used to form a signature vector that corresponds to a particular transmitter.

15. The method of claim 1, wherein the training period includes the transmission of the STS, and wherein the steps of generating, obtaining, and selecting are performed during the STS of the training period.

16. A method comprising:
at a receiver:
   detecting a training period of a transmission frame;
   generating a plurality of beam-formed signals using a plurality of predetermined analog weight coefficient (AWC) vectors;
   obtaining a set of measured signal levels by measuring a signal level of each of the beam-formed signals during the training period;
   selecting a previously stored beam-former AWC vector that corresponds to the set of measured signal levels, wherein the selecting comprises comparing the set of measured signal levels to previously stored sets of signature signal levels, and wherein each individual set of the stored sets of signature signal levels corresponds to a respective known transmitter out of multiple known transmitters;
   responsively configuring a beam-former with the previously stored beam-former AWC vector corresponding to one of the known transmitters, wherein the beam-former is configured with the previously stored beam-former AWC vector prior to a transmission of a Long Training Sequence (LTS) that follows a Short Training Sequence (STS); and
   processing the transmission frame using the selected previously stored beam-former AWC vector.

17. An apparatus comprising:
a configurable beam-former having a plurality of radio frequency signal inputs and having a control input for controlling a plurality of adjustable weight elements to generate a beam-formed signal based on a plurality of receive signals obtained from the plurality of radio frequency signal inputs;
a beam-former controller configured to provide a plurality of identifier control inputs to the configurable beam-former during a transmission identification period;

a training signal processor configured to generate a set of training signal measurements within the beam-formed signal during the transmission identification period, each training signal measurement of the set of training signal measurements corresponding to a beam-formed signal generated in response to a corresponding control input of a plurality of control inputs; and
a beam-former selector configured to select a previously stored beam-former analog weight coefficient (AWC) vector that corresponds to the set of training signal measurements generated by the training signal processor, the selected previously stored beam-former AWC vector to be used in configuring the configurable beam-former, wherein the configurable beam-former is configured with the selected previously stored beam-former AWC vector prior to a transmission of a Long Training Sequence (LTS) that follows a Short Training Sequence (STS).

18. A method comprising:
at a receiver:
   detecting a training period of a transmission frame;
   generating a plurality of beam-formed signals using a plurality of predetermined analog weight coefficient (AWC) vectors;
   obtaining a given signature vector based on a set of measured signal levels of the plurality of beam-formed signals during the training period;
   matching the given signature vector to one a plurality of signature vectors stored in a signature table by comparing the signature vector to the stored plurality of signature vectors, wherein each of the stored plurality of signature vectors corresponds to a particular transmitter;
   identifying a given transmitter corresponding to one of the stored plurality of signature vectors that matches the given signature vector;
   selecting a beam-former AWC vector previously stored in the signature table in correspondence with the identified transmitter, and responsively configuring a beam-former with the previously stored beam-former AWC vector, wherein the beam-former is configured with the previously stored beam-former AWC vector prior to a transmission of a Long Training Sequence (LTS) that follows a Short Training Sequence (STS); and
   processing the transmission frame using the selected previously stored beam-former AWC vector corresponding to the identified transmitter.

19. The method of claim 18, wherein a digital identity of the particular transmitter is stored in the signature table in association with a respective one of the stored plurality of signature vectors.

* * * * *